(12) United States Patent
Han et al.

(10) Patent No.: US 12,148,337 B2
(45) Date of Patent: Nov. 19, 2024

(54) CHIP ON FILM PACKAGE WITH TRENCH TO REDUCE SLIPPAGE AND DISPLAY DEVICE INCLUDING THE SAME

(71) Applicant: SAMSUNG ELECTRONICS CO., LTD., Suwon-si (KR)

(72) Inventors: Sanguk Han, Asan-si (KR); Jaemin Jung, Seoul (KR); Jeongkyu Ha, Hwaseong-si (KR); Kwanjai Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 343 days.

(21) Appl. No.: 17/679,587

(22) Filed: Feb. 24, 2022

(65) Prior Publication Data

US 2023/0036519 A1 Feb. 2, 2023

(30) Foreign Application Priority Data

Aug. 2, 2021 (KR) .................. 10-2021-0101525

(51) Int. Cl.
*H01L 23/532* (2006.01)
*G09G 3/20* (2006.01)
*H01L 23/00* (2006.01)

(52) U.S. Cl.
CPC .......... *G09G 3/20* (2013.01); *H01L 23/53209* (2013.01); *H01L 23/53271* (2013.01); *H01L 24/10* (2013.01); *G09G 2300/0408* (2013.01); *G09G 2300/0426* (2013.01)

(58) Field of Classification Search
None
See application file for complete search history.

(56) References Cited

U.S. PATENT DOCUMENTS

| | | | |
|---|---|---|---|
| 6,559,524 B2 | 5/2003 | Seko |
| 6,879,027 B2 | 4/2005 | Sato |
| 7,053,494 B2 | 5/2006 | Seko |
| 7,173,322 B2 | 2/2007 | Sakata et al. |
| 7,180,196 B2 | 2/2007 | Yamada et al. |
| 7,198,989 B2 | 4/2007 | Sakata et al. |
| 7,339,261 B2 | 3/2008 | Shimanuki et al. |
| 7,906,374 B2 | 3/2011 | Lin et al. |
| 8,394,495 B2 | 3/2013 | Heuft et al. |

(Continued)

FOREIGN PATENT DOCUMENTS

| | | |
|---|---|---|
| KR | 1020070038234 A | 4/2007 |
| KR | 1020180070919 A | 6/2018 |
| KR | 1020200107030 A | 9/2020 |

*Primary Examiner* — Joni Hsu
(74) *Attorney, Agent, or Firm* — Sughrue Mion, PLLC

(57) ABSTRACT

A chip on film package is provided. The chip on film package includes a film substrate with a base film, a conductive pad extending in a first direction on the base film, and a conductive line pattern extending from the conductive pad; a semiconductor chip provided on the film substrate; and a bump structure provided between the semiconductor chip and the conductive pad. A first peripheral wall and a second peripheral wall of the bump structure extend in the first direction and define a trench, a portion of the conductive pad is provided in the trench, and the conductive pad is spaced apart from at least one of the first peripheral wall and the second peripheral wall.

20 Claims, 19 Drawing Sheets

(56) References Cited

U.S. PATENT DOCUMENTS

| | | | | |
|---|---|---|---|---|
| 8,564,449 B2* | 10/2013 | Mitchell | ................ | G01N 3/066 |
| | | | | 73/146 |
| 2012/0025383 A1* | 2/2012 | Daubenspeck | ... | H01L 21/76885 |
| | | | | 257/E21.59 |
| 2012/0315726 A1* | 12/2012 | Byun | ...................... | H01L 24/05 |
| | | | | 438/109 |
| 2015/0102485 A1* | 4/2015 | Kang | ...................... | H01L 24/32 |
| | | | | 524/439 |
| 2017/0092655 A1* | 3/2017 | Jung | ...................... | H10B 43/10 |
| 2020/0051954 A1* | 2/2020 | Kim | ................... | H01L 27/14636 |
| 2020/0066545 A1* | 2/2020 | Kim | ......................... | H01L 24/03 |
| 2020/0286817 A1 | 9/2020 | Choi et al. | | |

* cited by examiner

CHIP ON FILM PACKAGE WITH TRENCH TO REDUCE SLIPPAGE AND DISPLAY DEVICE INCLUDING THE SAME

CROSS-REFERENCE TO RELATED APPLICATION

This application claims priority to Korean Patent Application No. 10-2021-0101525, filed on Aug. 2, 2021, in the Korean Intellectual Property Office, the disclosure of which is incorporated by reference herein in its entirety.

BACKGROUND

Methods, apparatuses and systems consistent with example embodiments relate to a chip on film package and a display device including the same, and more particularly, to a chip on film package on which a display driving integrated circuit is mounted and a display device including the chip on film package.

A chip on film (COF) package includes a semiconductor chip such as the display driving integrated circuit mounted on a film substrate. In the COF package, the semiconductor chip may be electrically connected to a lead of a film substrate through a bump structure. As display devices have recently been miniaturized, a technique for improving the reliability of the electrical connection between the bump structure and the leads while arranging the leads of the film substrate at a fine pitch is required.

SUMMARY

One or more example embodiments provide a chip on film package with improved reliability.

One or more example embodiments also provide a display device including a chip on film package having improved electrical connection reliability.

According to an aspect of an example embodiment, a chip on film package includes: a film substrate with a base film, a conductive pad extending in a first direction on the base film, and a conductive line pattern extending from the conductive pad; a semiconductor chip provided on the film substrate; and a bump structure provided between the semiconductor chip and the conductive pad. A first peripheral wall and a second peripheral wall of the bump structure extend in the first direction and define a trench, a portion of the conductive pad is provided in the trench, and the conductive pad is spaced apart from at least one of the first peripheral wall and the second peripheral wall.

According to an aspect of an example embodiment, a chip on film package includes: a film substrate including a base film, a conductive pad extending in a first direction on the base film, and a conductive line pattern extending from the conductive pad; a semiconductor chip provided on the film substrate, the semiconductor chip including a substrate, a chip pad provided on the substrate, and a passivation layer, the passivation layer being provided on a portion of the chip pad and defining an opening which exposes the chip pad; and a bump structure provided between the semiconductor chip and the conductive pad, and connected to the chip pad through the opening in the passivation layer. A first peripheral wall and a second peripheral wall of the bump structure extend in the first direction and define a trench, a portion of the conductive pad is provided in the trench, the conductive pad extends in the first direction past a first edge and a second edge of the bump structure, a length of the trench in the first direction is greater than a width of the trench in a second direction perpendicular to the first direction, a first width of the opening in the first direction is greater than a second width of the opening in the second direction, and a width of the trench in the second direction is greater than a width of the conductive pad in the second direction.

According to an aspect of an example embodiment, a display device includes: a chip on film package including a film substrate, a bump structure on the film substrate, and a display driving integrated circuit on the bump structure; a display panel connected to the film substrate; and a driving printed circuit board connected to the display panel and the chip on film package. The film substrate includes a base film, a conductive pad extending in a first direction on the base film, and a conductive line pattern extending from the conductive pad, a first peripheral wall and a second peripheral wall of the bump structure extend in the first direction and define a trench, wherein a portion of the conductive pad is provided in the trench, and the conductive pad is spaced apart from at least one of the first peripheral wall and the second peripheral wall.

According to an aspect of an example embodiment, a chip on film package includes: a film substrate including a base film, a conductive pad extending in a first direction on the base film, and a conductive line pattern extending from the conductive pad; a semiconductor chip provided on the film substrate; and a bump structure provided between the semiconductor chip and the conductive pad. A first peripheral wall and a second peripheral wall of the conductive pad extend in the first direction and define a trench, a portion of the bump structure is provided in the trench, and the bump structure is spaced apart from at least one of the first peripheral wall and the second peripheral wall.

BRIEF DESCRIPTION OF THE DRAWINGS

The above and other aspects, features, and advantages will be more clearly understood from the following detailed description, taken in conjunction with the accompanying drawings, in which.

DETAILED DESCRIPTION

Figure 1:
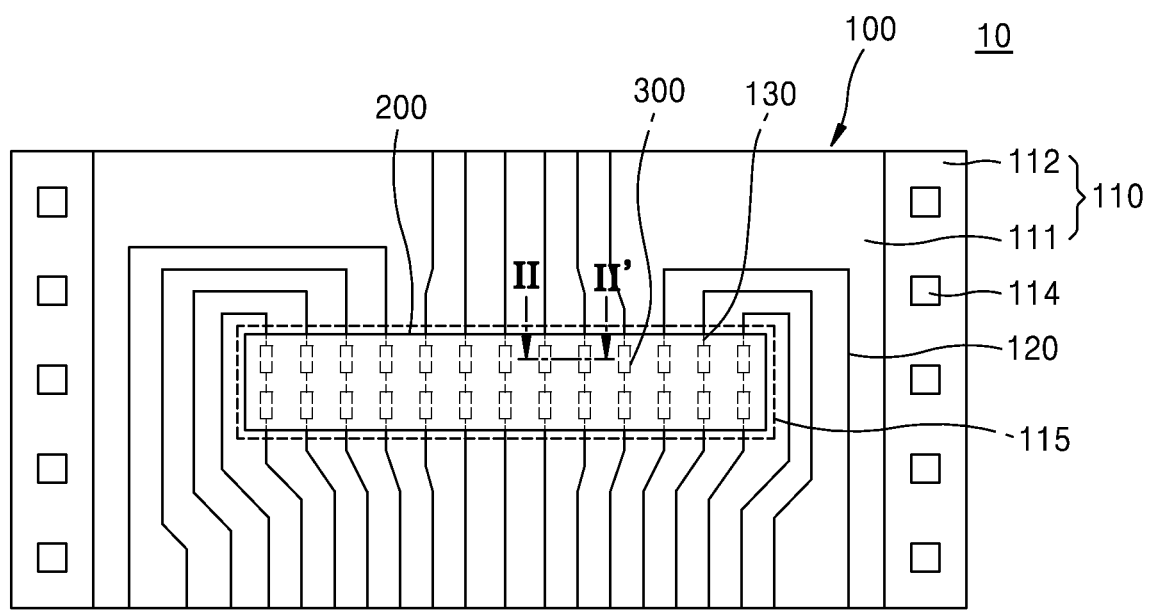
FIG. 1 is a plan view showing a chip on film package according to example embodiments.
Figure 1:
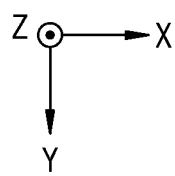

Hereinafter, example embodiments are described in detail with reference to the accompanying drawings. For the same components on the drawing, the same reference numerals are used, and redundant description thereof is omitted. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
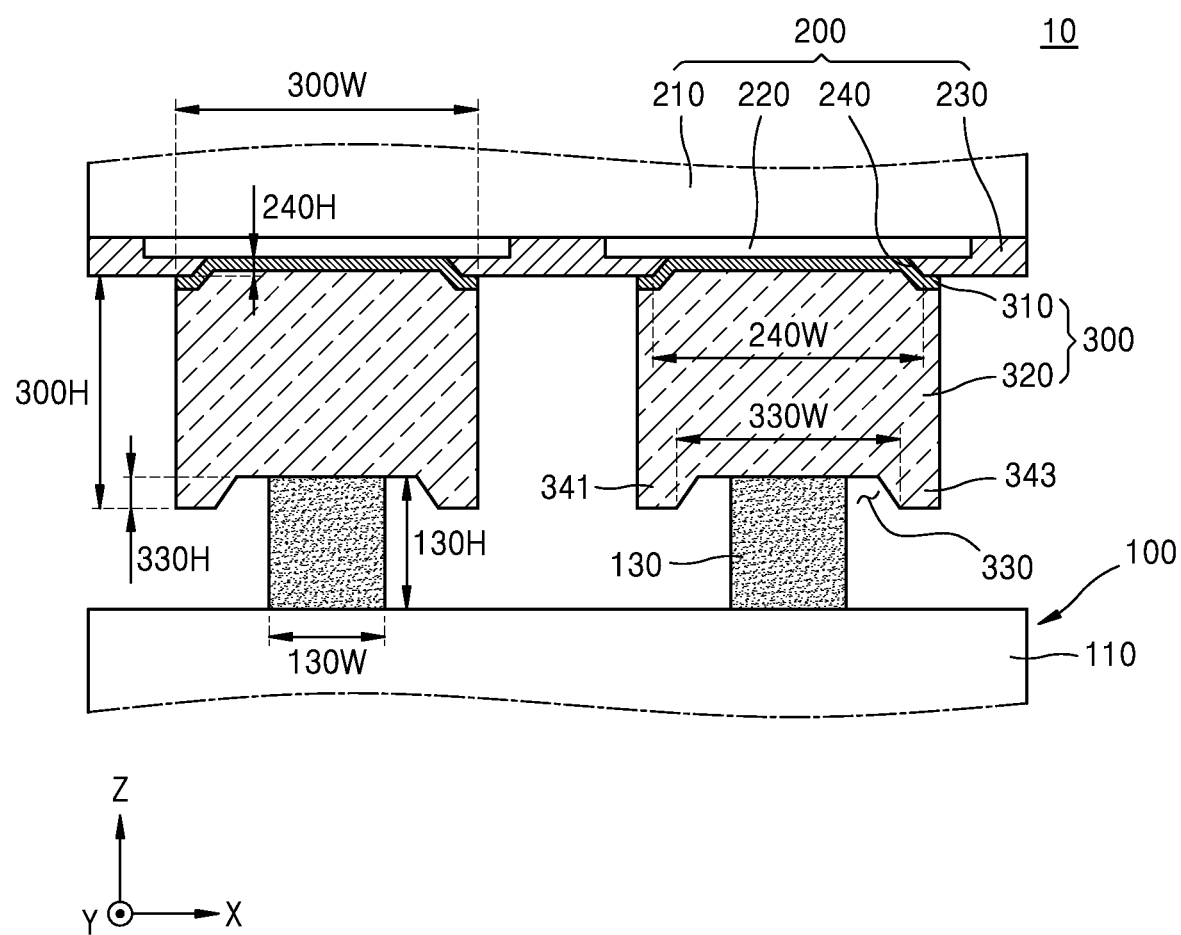
FIG. 2 is a cross-sectional view of a chip on film package according to example embodiments.
Figure 3:
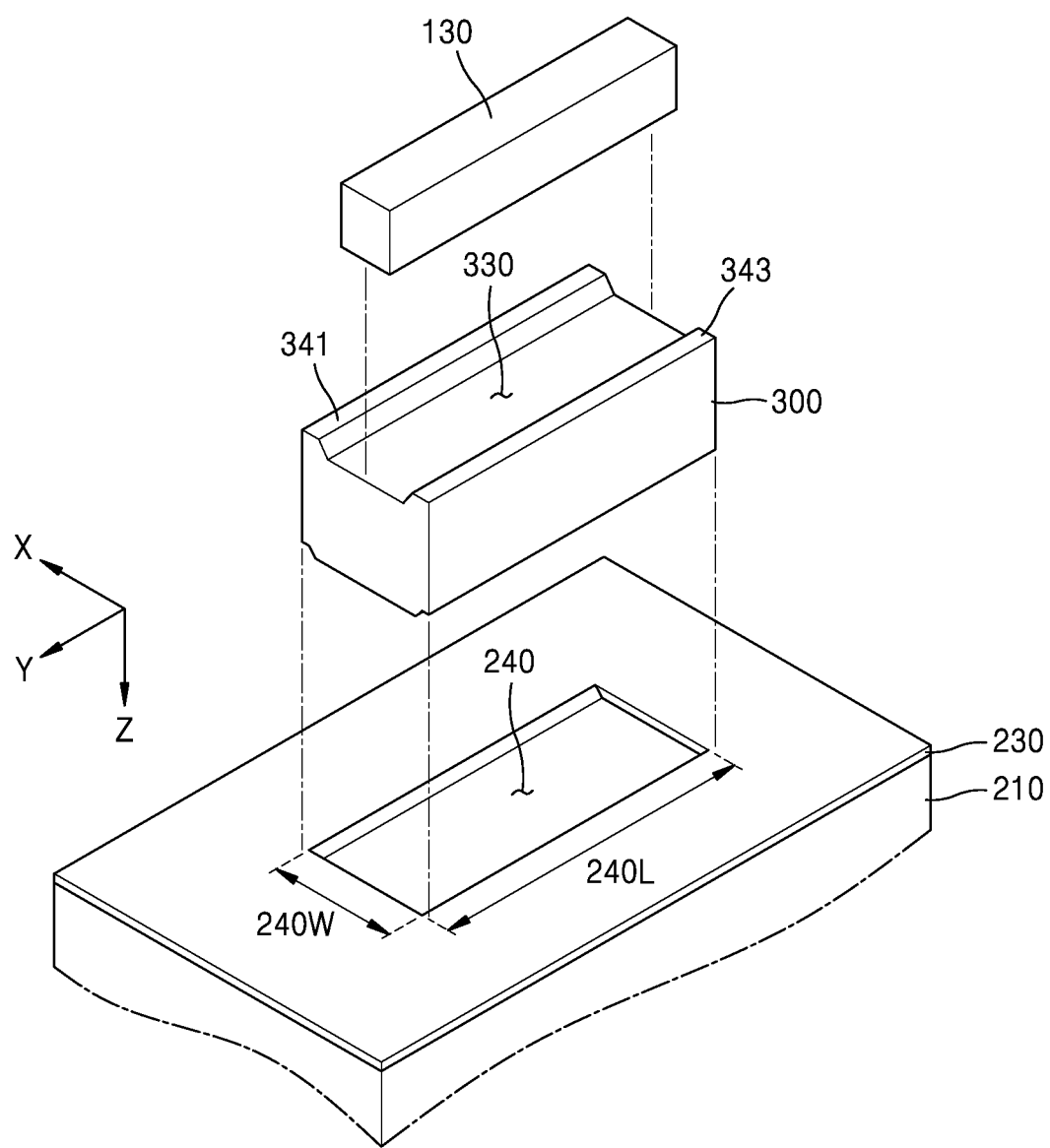
FIG. 3 is a separation perspective view showing a semiconductor chip, a bump structure, and a conductive pad according to example embodiments.
Figure 4:
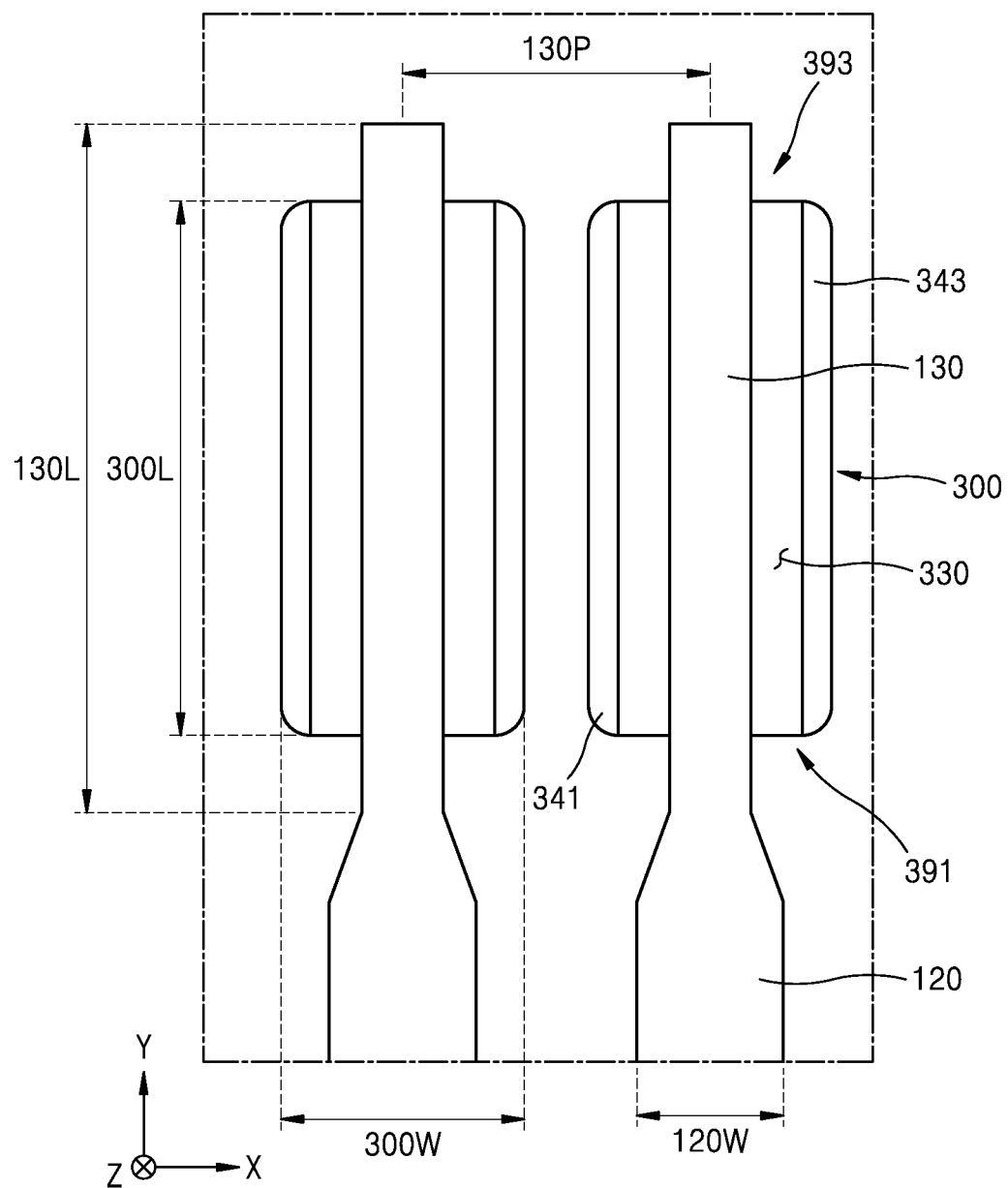
FIG. 4 is a layout diagram schematically showing a bump structure and a conductive pad according to example embodiments.
Figure 5:
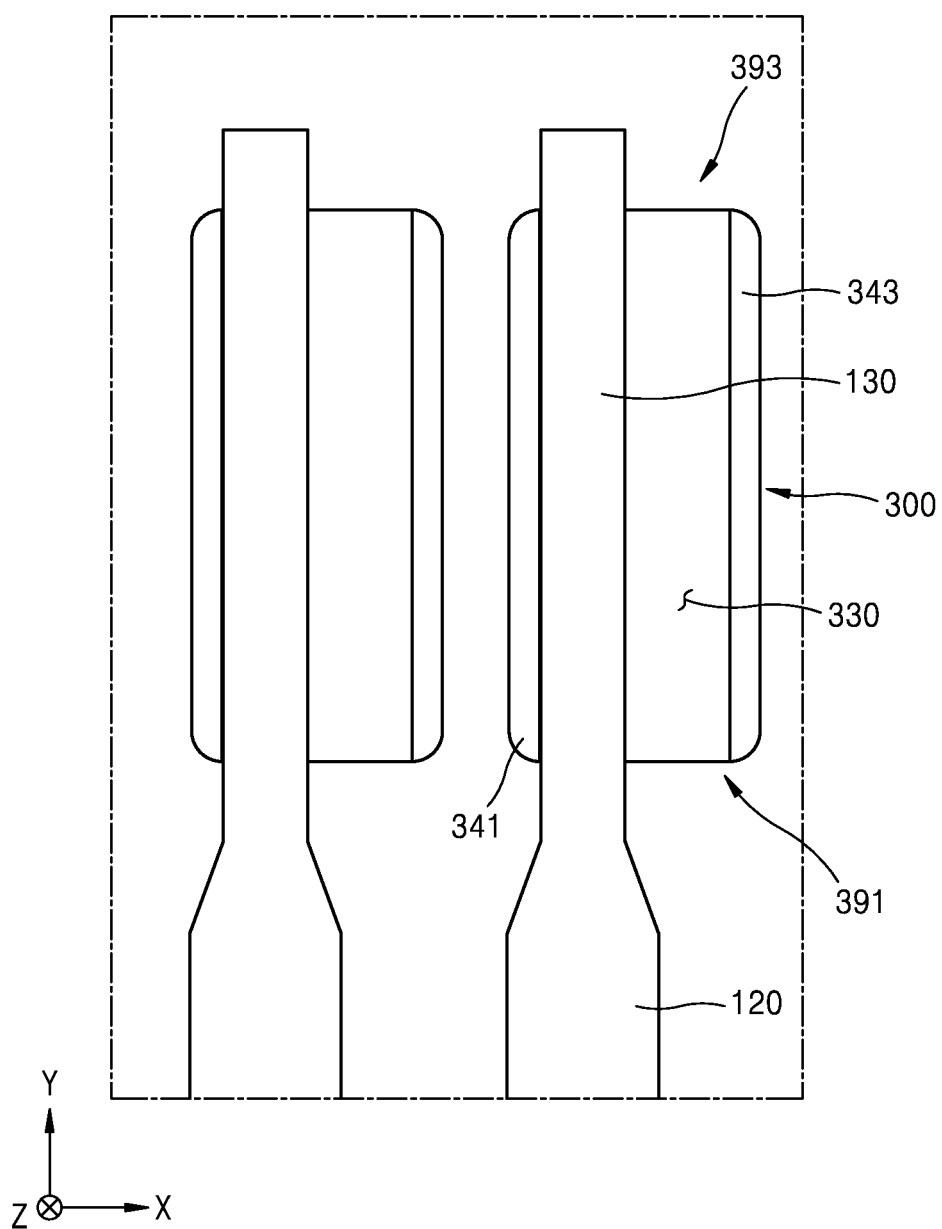
FIG. 5 is a layout diagram schematically showing a bump structure and a conductive pad according to example embodiments.

FIG. 1 is a plan view showing a chip on film package 10 according to example embodiments. FIG. 2 is a cross-sectional view of the chip on film package 10 of FIG. 1 taken along a line II-II'. FIG. 3 is an exploded perspective view showing the semiconductor chip 200, the bump structure 300, and the conductive pad 130 of FIG. 1. FIGS. 4 and 5 are layouts schematically showing a bump structure 300 and a conductive pad 130, respectively.

Referring to FIGS. 1 to 5, the chip on film package 10 may include a film substrate 100, a semiconductor chip 200, and a bump structure 300.

The film substrate 100 may include a base film 110, a conductive line pattern 120, and a conductive pad 130.

The base film 110 may be a flexible film including polyimide, which is a material having excellent heat resistance and excellent durability. However, the material of the base film 110 is not limited thereto, and the base film 110 may include, for example, at least one of an epoxy-based resin, acrylic, polyether nitrile, polyether sulfone, polyethylene terephthalate, polyethylene naphthalate.

The base film 110 may include a circuit region 111 and a perforation (PF) region 112. The circuit region 111 may include a chip mounting region 115 in which the semiconductor chip 200 is mounted. The PF region 112 may be disposed on both side ends of the base film 110.

Hereinafter, a direction parallel to the upper surface of the chip mounting region 115 of the base film 110 is defined as a horizontal direction (e.g., an X direction and/or a Y direction), and a direction perpendicular to the upper surface of the chip mounting region 115 of the base film 110 is defined as a vertical direction (e.g., a Z direction). Further, in the present specification, a horizontal width indicates a length in a horizontal direction (e.g., the X-direction and/or the Y-direction), and a vertical height indicates a length in a vertical direction (e.g., the Z-direction).

The PF region 112 may include a plurality of PF holes 114. Through the PF hole 114, reeling of the base film 110 to a winding reel and releasing of the base film 110 from the winding reel may be controlled. Because the pitch of the PF hole 114 is constant, a length of the base film 110 may be determined by the number of PF holes 114. The size of the base film 110 may be determined by the number and size of the semiconductor chips 200 mounted on the base film 110, the arrangement of the conductive line patterns 120 formed on the base film 110, and the like. The PF region 112 may be cut and removed before the chip on film package 10 is disposed on a device (e.g., display device 1000 of FIG. 14). That is, in the chip on film package 10, only the circuit region 111 of the base film 110 may be disposed on the device.

The conductive pad 130 may be arranged on the chip mounting region 115 of the base film 110. The conductive pad 130 may be connected to the conductive line pattern 120. The conductive pad 130 is positioned to overlap a chip pad 220 of the semiconductor chip 200 in a vertical direction (e.g., the Z direction), and may be electrically connected to the chip pad 220 of the semiconductor chip 200 through the bump structure 300.

The conductive pad 130 may extend in a first horizontal direction (e.g., the Y direction) on the chip mounting region 115 of the base film 110 in a plan view. For example, the conductive pad 130 may extend linearly on the chip mounting region 115 of the base film 110 in a plan view. The conductive pad 130 may include at least one of copper (Cu), aluminum (Al), annotation (Sn), gold (Au), nickel (Ni), lead (Pb), palladium (PD), and solder.

In example embodiments, the conductive pad 130 is a part of the conductive line pattern 120 and may be formed with the conductive line pattern 120. In other example embodiments, the conductive pad 130 may be formed through a process separate from the process of forming the conductive line pattern 120, and may have a material and/or a material composition different from that of the conductive line pattern 120. In example embodiments, the conductive pad 130 may have a structure in which a plating layer including at least one of tin (Sn), gold (Au), nickel (Ni), lead (Pb), palladium (Pd), solder is disposed on a conductor including the same material as that of the conductive line pattern 120.

In example embodiments, a horizontal width 130W in a second horizontal direction (e.g., the X direction) of the conductive pad 130 may be between about 4 micrometers (μm) and about 8 μm. For example, the horizontal width 130W in the second horizontal direction (e.g., the X direction) of the conductive pad 130 may be about 6 μm.

In example embodiments, a vertical height 130H of the conductive pad 130 may be between about 6 μm and about 10 μm.

In example embodiments, a pitch 130P between two adjacent conductive pads 130 may be about 20 μm or less. The pitch 130P between the two adjacent conductive pads 130 may be defined as a distance in the second horizontal direction (e.g., the X direction) between centers of two conductive pads 130 adjacent in the second horizontal direction (e.g., the X direction).

The conductive line pattern 120 may extend on the base film 110 and may be connected to the conductive pad 130. For example, the conductive line pattern 120 may extend to the edge of the base film 110 from the conductive pad 130.

For example, the conductive line pattern 120 may include copper (Cu), aluminum (AL), and the like. For example, the conductive line pattern 120 may be formed of a copper foil or an aluminum foil. In some example embodiments, the conductive line pattern 120 may be formed by forming a metal layer on the base film 110 by using a process such as casting, laminating, or electro-plating and patterning the metal layer formed on the base film 110.

In example embodiments, a horizontal width 120W of the conductive line pattern 120 may be greater than the horizontal width 130W of the conductive pad 130. In example embodiments, the horizontal width 120W of the conductive line pattern 120 may be greater than the horizontal width 130W of the conductive pad 130 by 2 μm or more. For example, a difference between the horizontal width 120W of the conductive line pattern 120 and the horizontal width 130W of the conductive pad 130 may be between about 2 μm and about 5 μm.

In example embodiments, a vertical height of the conductive line pattern 120 may be substantially the same as or similar to the vertical height 130H of the conductive pad 130.

The film substrate 100 may further include an insulating protective layer provided on the base film 110. The insulating protective layer may be provided on, and for example, may cover the base film 110 and the conductive line pattern 120. The insulating protective layer is provided on the conductive line pattern 120 to prevent the conductive line pattern 120 from being physically and/or chemically damaged by an external environment. The insulating protective layer may be formed to not be provided on the conductive pad 130. In some example embodiments, the insulating protective layer may include a solder resist or a dry film resist. In some example embodiments, the insulating protective layer may include silicon oxide and/or silicon nitride.

Further, an underfill material layer filled in a gap between the semiconductor chip 200 and the base film 110 may be provided on the chip mounting region 115 of the base film 110. The underfill material layer may be provided on the bump structure 300 and the conductive pad 130. In some example embodiments, the underfill material layer may be formed by a capillary underfill process. The underfill material layer may be formed of, for example, an epoxy resin.

The semiconductor chip 200 may be mounted on the chip mounting region 115 of the base film 110 through a flip chip bonding process. The semiconductor chip 200 may include a display driving integrated circuit (DDI) used to drive the display device 1000. For example, the semiconductor chip 200 may include a source driving chip that generates an image signal using a data signal transmitted from a timing controller and outputs the image signal to a display panel (e.g., display panel 500 of FIG. 14). For example, the semiconductor chip 200 may include a gate driving chip that outputs a scan signal including an on/off signal of a transistor to the display panel 500. However, the type of the semiconductor chip 200 is not limited thereto. For example, when the chip on film package 10 is coupled to an electronic device other than a display device, the semiconductor chip 200 may include a chip for driving the corresponding electronic device.

For convenience of explanation, one semiconductor chip 200 is shown in FIG. 1, but the number of semiconductor chips 200 is not limited thereto. For example, depending on the characteristics of the display device 1000, the number of the source driving chips may be equal to or greater than the number of the gate driving chips.

The semiconductor chip 200 may have a rectangular form in a plan view. For example, the semiconductor chip 200 may have a short side extending in the first horizontal direction (e.g., the Y direction) and a long side extending in the second horizontal direction (e.g., the X direction), in a plan view. For example, the length of the long side of the semiconductor chip 200 may be about 1.5 times or more of the length of the short side.

The semiconductor chip 200 may include a substrate 210, a plurality of chip pads 220, and a passivation layer 230.

The substrate 210 is a semiconductor substrate and may include a lower surface and an upper surface opposite to each other. The lower surface of the substrate 210 is a surface facing the film substrate 100, and may be an active surface of the substrate 210. The upper surface of the substrate 210 may be an inactive surface of the substrate 210. The substrate 210 may be a silicon (Si) wafer including crystalline silicon, polycrystalline silicon, or amorphous silicon. Alternatively, the substrate 210 may include a semiconductor element such as germanium (Ge), or a compound semiconductor such as silicon carbide (SiC), gallium arsenide (GaAs), indium arsenide (InAs), and indium phosphide (InP). The substrate 210 may have a silicon on insulator (SOI) structure. In some example embodiments, the substrate 210 may include a conductive region, for example, a well doped with an impurity or a structure doped with an impurity. In addition, the substrate 210 may have various device isolation structures such as a shallow trench isolation (STI) structure.

The plurality of chip pads 220 of the semiconductor chip 200 may be disposed on the active surface of the substrate 210. At least one of the plurality of chip pads 220 of the semiconductor chip 200 may function as an input terminal, and at least one of the plurality of chip pads 220 of the semiconductor chip 200 may function as an output terminal.

The passivation layer 230 may be provided on one surface of the substrate 210 and a portion of the chip pad 220. The passivation layer 230 may include an opening 240 for exposing the chip pad 220. In example embodiments, the passivation layer 230 may be formed of an inorganic insulating layer or an organic insulating layer. For example, the passivation layer 230 may include silicon oxide and/or silicon nitride. For example, the passivation layer 230 may include an insulating material made of a photo imageable dielectric (PID) material capable of a photolithography process. For example, the passivation layer 230 may include photosensitive polyimide.

The bump structure 300 may be provided between the semiconductor chip 200 and the film substrate 100. An upper portion of the bump structure 300 may fill at least a part of the opening 240 in the passivation layer 230, and may be connected to the chip pad 220 of the semiconductor chip 200 through the opening 240 in the passivation layer 230. A lower portion of the bump structure 300 may be connected to the conductive pad 130 of the film substrate 100 As the bump structure 300 is coupled to the chip pad 220 of the semiconductor chip 200 and the conductive pad 130 of the film substrate 100, the semiconductor chip 200 may be mounted on the film substrate 100.

The semiconductor chip 200 may receive at least one of a control signal, a power signal, and a ground signal for operating the semiconductor chip 200 from the outside, through the bump structure 300. The semiconductor chip 200 may receive a data signal indicating data to be stored in the semiconductor chip 200 from the outside through the bump structure 300. The semiconductor chip 200 may provide a data signal indicating data stored in the semiconductor chip 200 to the outside through the bump structure 300.

In example embodiments, the bump structure 300 may include a lower metal layer 310 and a pillar layer 320.

The lower metal layer 310 may be connected to the passivation layer 230 and the chip pad 220 of the semiconductor chip 200. The lower metal layer 310 may conformally extend along the surface of the passivation layer 230 and the surface of the chip pad 220 exposed through the opening 240 in the passivation layer 230. The lower metal layer 310 may be a seed layer and/or an adhesive layer for forming the pillar layer 320. The lower metal layer 310, for example, chromium (Cr), tungsten (W), titanium (Ti), copper (Cu), nickel (Ni), aluminum (Al), palladium (PD), gold (Au) or combinations thereof may be included.

The lower metal layer 310 may be one metal layer and may be a stack structure including a plurality of metal layers. For example, the lower metal layer 310 may include a first metal layer and a second metal layer sequentially stacked on the chip pad 220 of the semiconductor chip 200. The first metal layer may serve as an adhesive layer for stably attaching the pillar layer 320 to the chip pad 220 and/or the passivation layer 230, and may include a metal material having excellent adhesion properties to the first passivation layer 230. For example, the first metal layer may include at least one of titanium (Ti), titanium-tungsten (Ti—W), chromium (CR), and aluminum (Al). The second metal layer may serve as a seed layer for forming the pillar layer 320. The second metal layer may include at least one of nickel (Ni), copper (Cu), aluminum (AL).

The pillar layer 320 may be disposed on the lower metal layer 310. The pillar layer 320 may have a substantially quadrangular pillar form. Sidewalls of the pillar layer 320 may be substantially flat. The pillar layer 320 may include gold (Au), copper (Cu), nickel (Ni), palladium (PD), platinum (PT), or a combination thereof. In example embodiments, the pillar layer 320 may be formed of gold (Au).

The bump structure 300 may extend along the conductive pad 130. For example, the bump structure 300 and the conductive pad 130 may extend in the first horizontal direction (e.g., the Y direction), and the conductive pad 130 may be continuously connected to the bump structure 300 from one side 391 to the other side 393 of the bump structure 300.

The bump structure 300 may have a rectangular form in a plan view. For example, the bump structure 300 may have a long side extending in a first horizontal direction (e.g., the Y direction) and a short side extending in a second horizontal direction (e.g., the X direction), in a plan view.

In example embodiments, a length 130L of the conductive pad 130 extending in the first horizontal direction (e.g., the Y direction) may be greater than a length 300L of the bump structure 300 in the first horizontal direction (e.g., the Y direction). In example embodiments, the conductive pad 130 may protrude outward from each of the one side 391 and the other side 393 of the bump structure 300.

In example embodiments, the length 300L in the first horizontal direction (e.g., the Y direction) of the bump structure 300 may be between about 30 µm and about 50 µm.

In example embodiments, a horizontal width 300W in the second horizontal direction (e.g., the X direction) of the bump structure 300 may be between about 10 µm and about 18 µm. In example embodiments, the horizontal width 300W in the second horizontal direction (e.g., the X direction) of the bump structure 300 may be greater than the horizontal width 130W in the second horizontal direction (e.g., the X direction) of the conductive pad 130.

In example embodiments, a vertical height 300H of the bump structure 300 may be between about 9 µm and about 15 µm. The vertical height 300H of the bump structure 300 may indicate a height in the vertical direction (e.g., the Z direction) of the bump structure 300 measured on the basis of the surface of the passivation layer 230. In example embodiments, the vertical height 300H of the bump structure 300 may be greater than the vertical height 130H of the conductive pad 130.

The bump structure 300 may define a trench 330 accommodating a part of the conductive pad 130. The trench 330 may extend from one side 391 to the other side 393 of the bump structure 300 in the first horizontal direction (e.g., the Y direction). The conductive pad 130 may be continuously connected to the surface of the bump structure 300 defining the trench 330 from one side 391 to the other side 393 of the bump structure 300.

The bump structure 300 may include a first peripheral wall 341 and a second peripheral wall 343 spaced apart from each other with the trench 330 therebetween. The trench 330 may be defined by the first peripheral wall 341 and the second peripheral wall 343. The first peripheral wall 341 and the second peripheral wall 343 may each be a part of the pillar layer 320. The first peripheral wall 341 may extend from one side 391 to the other side 393 of the bump structure 300 along the edge of the lower surface of the bump structure 300, and the second peripheral wall 343 may extend from one side 391 to the other side 393 of the bump structure 300 along the other edge of the lower surface of the bump structure 300.

When the semiconductor chip 200 is mounted on the film substrate 100 in a flip-chip method, the bump structure 300 is attached to the semiconductor chip 200, and a thermal compression bonding process for bonding the bump structure 300 and the conductive pad 130 may be performed. In related devices, while the thermal compression bonding process is performed, a slip phenomenon may occur in which a conductive pad moves along the surface of a bump structure, and a reliability of connection between the conductive pad and the bump structure may be deteriorated due to the slip phenomenon.

According to example embodiments, because a part of the conductive pad 130 is accommodated by the trench 330 of the bump structure 300, while the thermal compression bonding process is performed, the slip phenomenon between the conductive pad 130 and the bump structure 300 may be prevented and suppressed. For example, even when the conductive pad 130 slides along the surface of the bump structure 300 while the thermal compression bonding process is performed, a sliding range of the conductive pad 130 may be limited by the first peripheral wall 341 and the second peripheral wall 343. Because the slip phenomenon between the conductive pad 130 and the bump structure 300 may be prevented and suppressed while the thermal compression bonding process is performed, the reliability of the connection between the conductive pad 130 and the bump structure 300 may be improved, and ultimately, the reliability of the chip on film package 10 may be improved.

In example embodiments, the vertical height 330H of the trench 330 may be between about 0.2 µm and about 2 µm. If the vertical height 330H of the trench 330 is less than 0.2 µm, it may be difficult to sufficiently suppress the slip phenomenon between the conductive pad 130 and the bump structure 300 while the thermal compression bonding process is performed. If the vertical height 330H of the trench 330 is greater than 2 µm, the structural stability of the bump structure 300 may be deteriorated.

In example embodiments, the horizontal width 330W in the second horizontal direction (e.g., the X-direction) of the trench 330 may be greater than the horizontal width 130W in the second horizontal direction (e.g., the X-direction) of the conductive pad 130. For example, the horizontal width 330W of the trench 330 in the second horizontal direction (e.g., the X-direction) may be about 1.5 to 2.5 times the horizontal width 130W of the conductive pad 130 in the second horizontal direction (e.g., the X-direction). For example, the horizontal width 330W of the trench 330 in the second horizontal direction (e.g., the X direction) may be between about 8 μm and about 16 μm.

Because the horizontal width 330W of the trench 330 in the second horizontal direction (e.g., the X direction) is greater than the horizontal width 130W of the conductive pad 130 in the second horizontal direction (e.g., the X direction), the conductive pad 130 may be spaced apart from at least one of the first peripheral wall 341 and the second peripheral wall 343. In example embodiments, as shown in FIG. 4, the conductive pad 130 may be spaced from both the first peripheral wall 341 and the second peripheral wall 343. In example embodiments, as shown in FIG. 5, the conductive pad 130 may be in contact with only one of the first and second peripheral walls 341 and 343, and may be spaced apart from the other of the first and second peripheral walls 341 and 343.

The trenches 330 of the bump structure 300 may overlap with the opening 240 of the passivation layer 230 in a plan view. The bump structure 300 may be formed on the semiconductor chip 200 through a plating process, and an upper portion of the bump structure 300 may be formed to fill the opening 240 of the passivation layer 230. In this case, a trench 330 may be formed in the lower portion of the bump structure 300 corresponding to the upper portion of the bump structure 300 that is formed in the opening 240 of the passivation layer 230.

In example embodiments, the planar form of the opening 240 of the passivation layer 230 may be similar to the planar form of the bump structure 300 or the planar form of the trench 330 of the bump structure 300. The opening 240 of the passivation layer 230 may have a rectangular form in a plan view. For example, the opening 240 of the passivation layer 230 may have a long side extending in a first horizontal direction (e.g., the Y direction) and a short side extending in a second horizontal direction (e.g., the X direction) in a plan view. That is, a length 240L of the opening 240 of the passivation layer 230 in the first horizontal direction (e.g., the Y direction) may be greater than a horizontal width 240W of the opening 240 of the passivation layer 230 in the second horizontal direction (e.g., the X direction).

In example embodiments, the length 240L of the opening 240 of the passivation layer 230 in the first horizontal direction (e.g., the Y direction) may be equal to or less than the length of the trench 330 in the first horizontal direction (e.g., the Y direction). In example embodiments, the horizontal width 240W in the second horizontal direction (e.g., the X direction) of the opening 240 of the passivation layer 230 may be equal to or less than the horizontal width 330W in the second horizontal direction (e.g., the X direction) of the trench 330.

In example embodiments, in order to adjust the dimension of the trench 330 of the bump structure 300, the dimension of the opening 240 of the passivation layer 230 may be adjusted.

In example embodiments, in order to adjust the horizontal width 330W of the trench 330 in the second horizontal direction (e.g., the X direction), the horizontal width 240W of the opening 240 of the passivation layer 230 may be adjusted in the second horizontal direction (e.g., the X direction). For example, by increasing the horizontal width 240W in the second horizontal direction (e.g., the X direction) of the opening 240 of the passivation layer 230, the horizontal width 330W in the second horizontal direction (e.g., the X direction) of the trench 330 may be increased.

In example embodiments, in order to adjust the length of the trench 330 in the first horizontal direction (e.g., the Y direction), the length 240L of the opening 240 of the passivation layer 230 may be adjusted in the first horizontal direction (e.g., the Y direction). For example, by increasing the length 240L of the opening 240 of the passivation layer 230 in the first horizontal direction (e.g., the Y direction), the length of the trench 330 in the first horizontal direction (e.g., the Y direction) may be increased.

In example embodiments, in order to adjust the vertical height 330H of the trench 330, the thickness of the passivation layer 230 and the vertical height 240H of the opening 240 of the passivation layer 230 may be adjusted. For example, by increasing the vertical height 240H of the opening 240 of the passivation layer 230, the vertical height 330H of the trench 330 may be increased.

In example embodiments, in order to adjust the form and size of the trench 330 of the bump structure 300, a bump conditioning process of removing a part of the bump structure 300 may be further performed.

Figure 6:
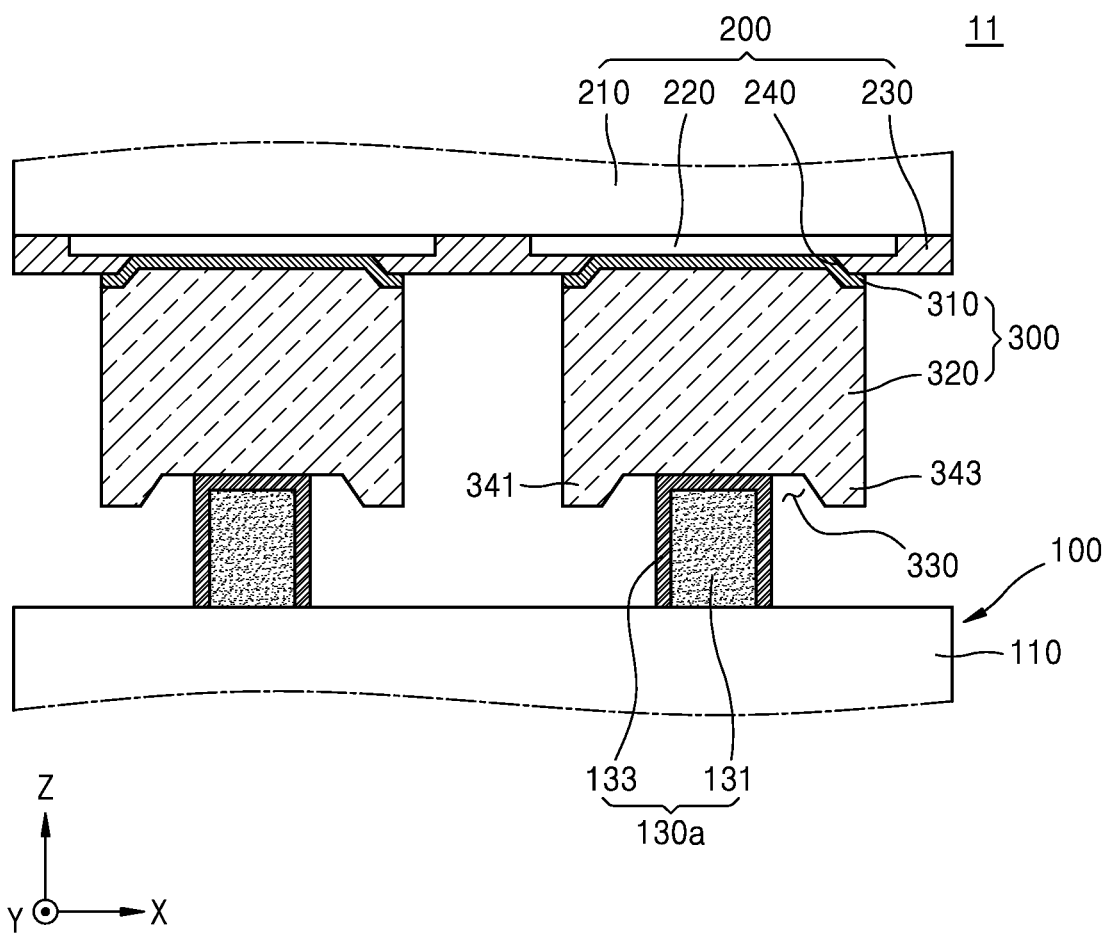
FIG. 6 is a cross-sectional view showing a part of a chip on film package according to example embodiments.

FIG. 6 is a cross-sectional view showing a part of the chip on film package 11 according to example embodiments.

In FIG. 6, a part of the chip on film package 11 corresponding to the cut area according to the II-II' line of FIG. 1 is shown. Hereinafter, the chip on film package 11 shown in FIG. 6 is described with a focus on differences from the chip on film package 10 described with reference to FIGS. 1 to 5.

Referring to FIG. 6 together with FIG. 1, a conductive pad 130a may include a core conductive layer 131 and a first conductive cover layer 133 provided on the core conductive layer 131. The first conductive cover layer 133 may be disposed between the core conductive layer 131 and a bump structure 300.

The core conductive layer 131 may include a first metal, and the first conductive cover layer 133 may include a second metal different from the first metal. For example, the core conductive layer 131 may include at least one of copper (Cu), aluminum (Al), and gold (Au). The material and material composition of the core conductive layer 131 may be the same as the conductive line pattern 120. For example, the first conductive cover layer 133 may include at least one of tin (Sn), nickel (Ni), lead (Pb), palladium (PD), and solder. For example, the first conductive cover layer 133 may be coated on the surface of the core conductive layer 131 through a plating method, and may have a thickness of about 0.5 μm or less. The first conductive cover layer 133 may improve adhesion between the bump structure 300 and the conductive pad 130a.

Figure 7:
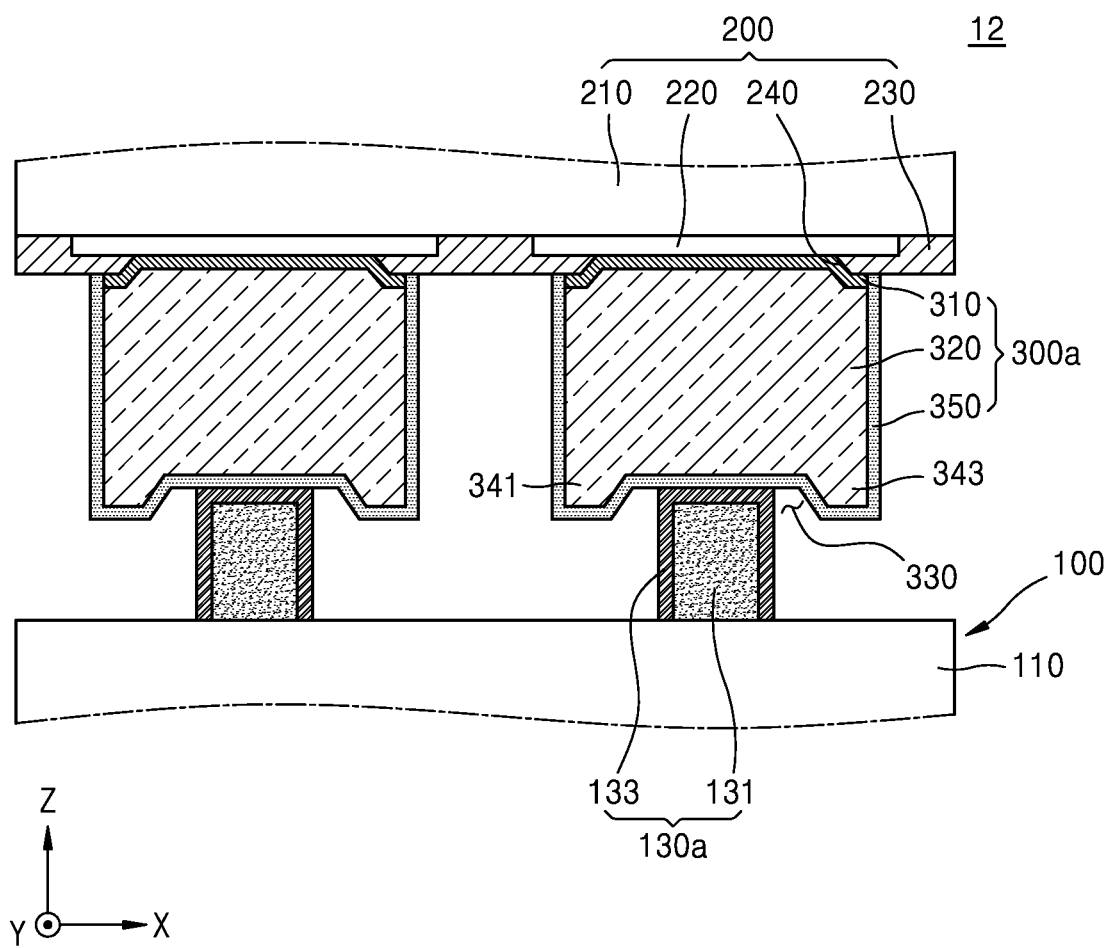
FIG. 7 is a cross-sectional view showing a part of a chip on film package according to example embodiments.

FIG. 7 is a cross-sectional view showing a part of a chip on film package 12 according to example embodiments.

In FIG. 7, a part of the chip on film package 12 corresponding to the cut area according to the II-II' line of FIG. 1 is shown. Hereinafter, the chip on film package 12 shown in FIG. 7 is described with a focus on differences from the chip on film package 11 described with reference to FIG. 6.

Referring to FIG. 7 together with FIG. 1, a bump structure 300a may include a second conductive cover layer 350 provided on a pillar layer 320. The second conductive cover layer 350 may be disposed between the pillar layer 320 and a conductive pad 130a. When the pillar layer 320 includes a third metal, the second conductive cover layer 350 may include a fourth metal different from that of the third metal. For example, the second conductive cover layer 350 may include at least one of tin (Sn), nickel (Ni), lead (Pb), palladium (PD), and solder. For example, the second conductive cover layer 350 may be coated on the surface of the pillar layer 320 through a plating method, and may have a thickness of about 0.5 μm or less. The second conductive cover layer 350 may improve the adhesion between the bump structure 300a and the conductive pad 130a.

Figure 8:
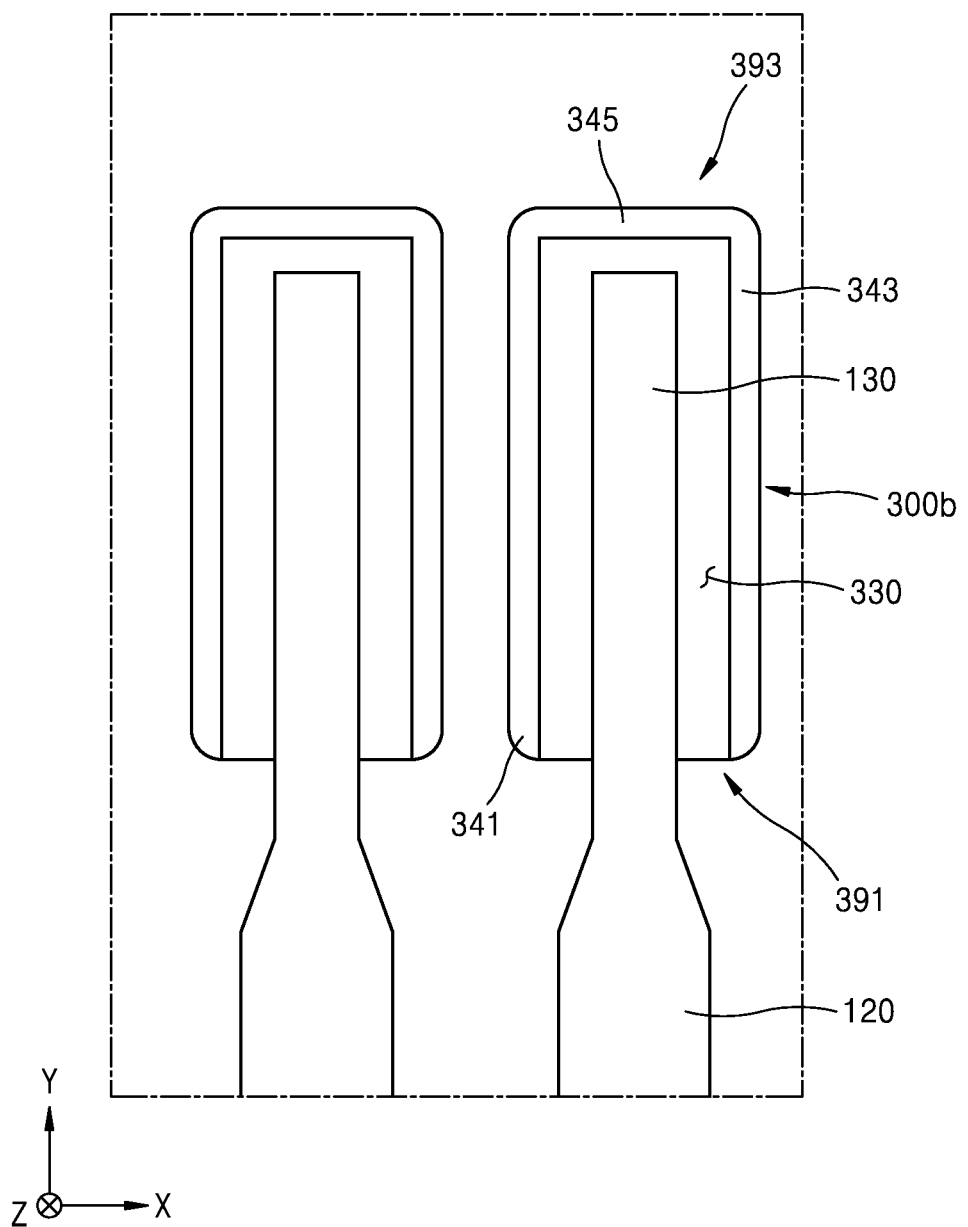
FIG. 8 is a layout diagram schematically showing a bump structure and a conductive pad contained in a chip on film package according to example embodiments.

FIG. 8 is a layout diagram schematically showing a bump structure 300b and a conductive pad 130, which are included in a chip on film package according to example embodiments.

Hereinafter, the chip on film package shown in FIG. 8 is described with a focus on differences from the chip on film package 10 described with reference to FIGS. 1 to 5.

Referring to FIG. 8, the bump structure 300b may include a third peripheral wall 345 disposed adjacent to the other side 393 of the bump structure 300b. The third peripheral wall 345 may extend in a second horizontal direction (e.g., the X direction) between the first peripheral wall 341 and a second peripheral wall 343. In this case, a trench 330 may extend from one side 391 of the bump structure 300b to the point adjacent to the third peripheral wall 345. Further, the conductive pad 130 protrudes outwardly from one side 391 of the bump structure 300b, but does not extend past the other side 393 of the bump structure 300b.

Figure 9:
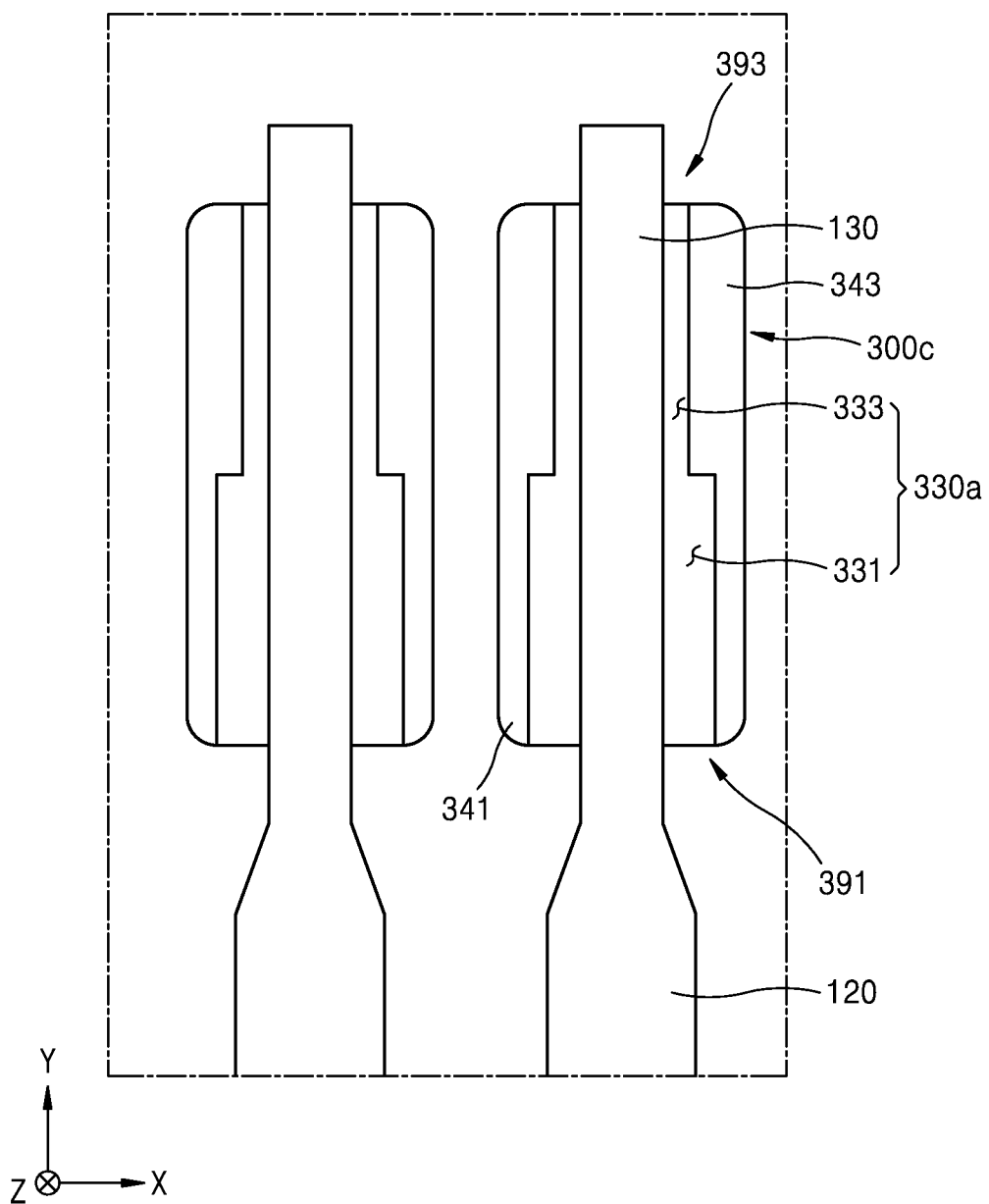
FIG. 9 is a layout diagram schematically showing a bump structure and a conductive pad included in a chip on film package according to example embodiments.

FIG. 9 is a layout diagram schematically showing a bump structure 300c and a conductive pad 130 included in a chip on film package according to example embodiments.

Hereinafter, the chip on film package shown in FIG. 9 is described with a focus on differences from the chip on film package 10 described with reference to FIGS. 1 to 5.

Referring to FIG. 9, a horizontal width in a second horizontal direction (e.g., the X direction) of a trench 330a may be configured to vary along the first horizontal direction (e.g., the Y direction) of the trench 330a.

In example embodiments, a horizontal width of one end of the trench 330a on one side 391 of the bump structure 300c may be greater than a horizontal width of the other end of the trench 330a on the other side 393 of the bump structure 300c.

In example embodiments, the trench 330a may include a first portion 331 and a second portion 333 having different horizontal widths. The first portion 331 of the trench 330a may extend from one side 391 of the bump structure 300c, and the second portion 333 of the trench 330a may extend from the first portion 331 of the trench 330a to the other side 393 of the bump structure 300c. The first portion 331 of the trench 330a may have a first horizontal width in the second horizontal direction (e.g., the X direction), and the second portion 333 of the trench 330a may have a second horizontal width less than the first horizontal width in the second horizontal direction (e.g., the X direction).

In example embodiments, the first horizontal width of the trench 330a may be substantially constant throughout the first portion 331, and the second horizontal width of the trench 330a may be substantially constant throughout the second portion 3333. In other example embodiments, the horizontal width of the trench 330a may gradually narrow from one side 391 to the other side 393 of the bump structure 300c. In other example embodiments, the horizontal width of the trench 330 may gradually increase in width from one side 391 to the other side 393 of the bump structure 300c.

Figure 10:
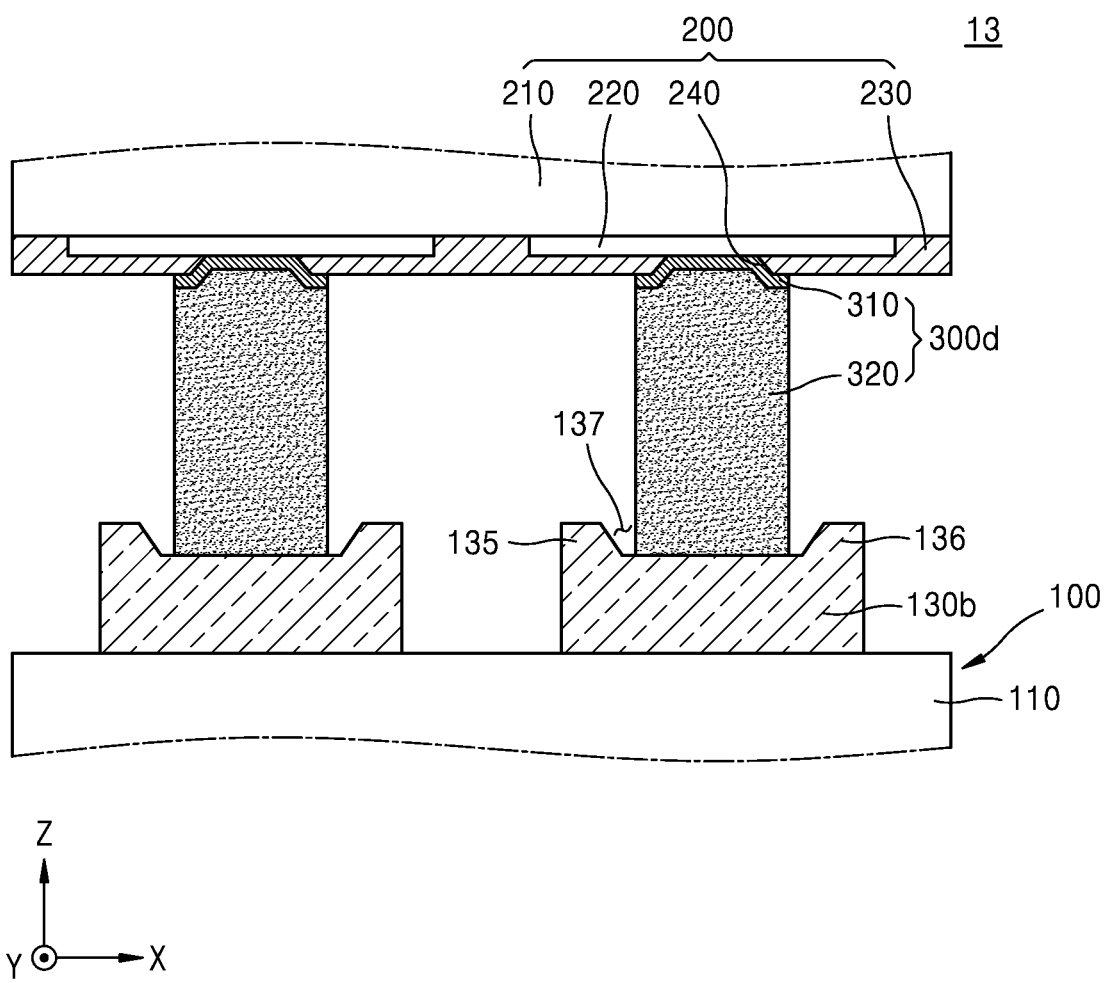
FIG. 10 is a cross-sectional view showing a part of a chip on film package according to example embodiments.
Figure 11:
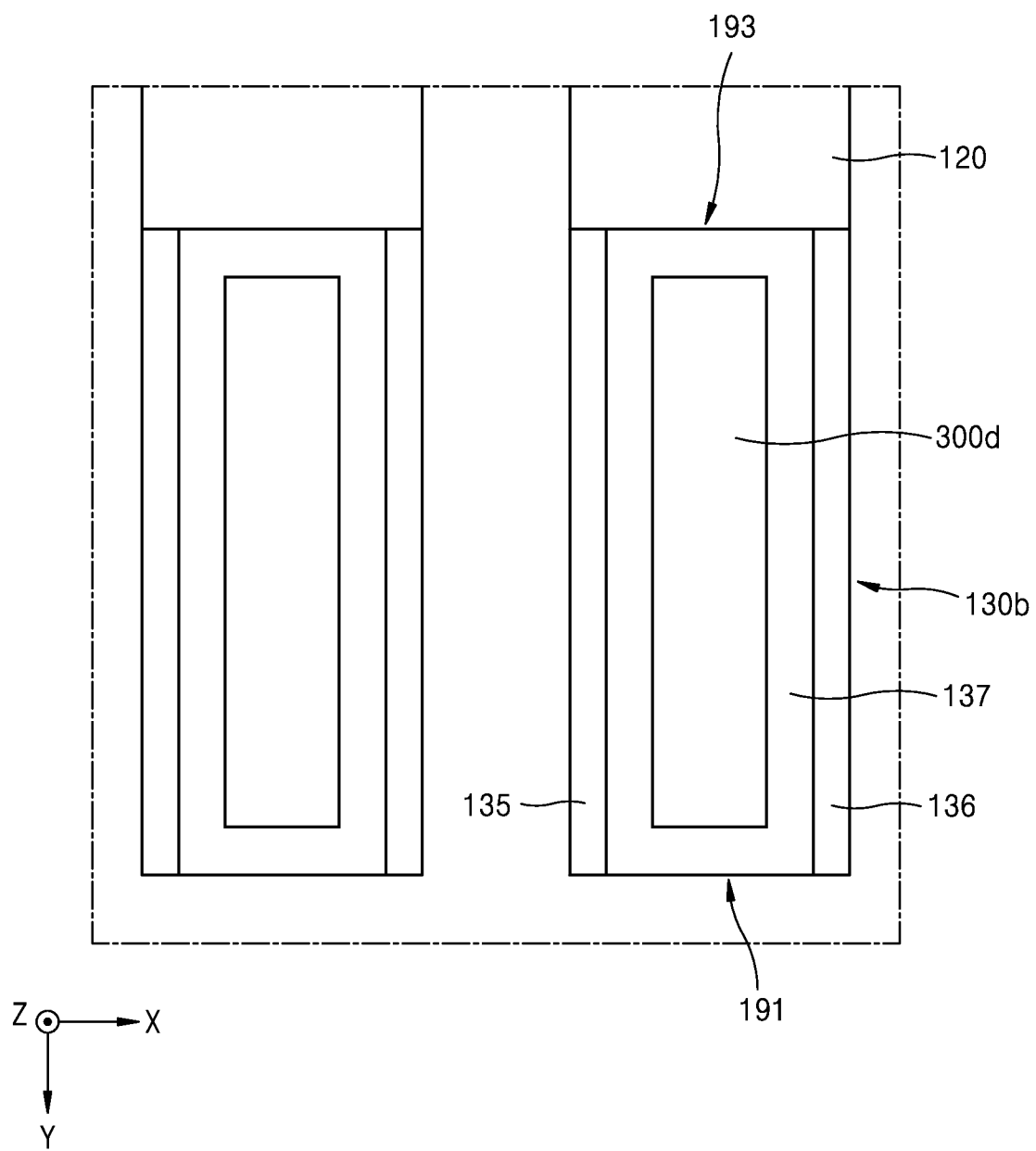
FIG. 11 is a layout diagram schematically showing a bump structure and a conductive pad according to example embodiments.

FIG. 10 is a cross-sectional view showing a part of a chip on film package 13 according to example embodiments. FIG. 11 is a layout diagram schematically showing a bump structure 300d and a conductive pad 130b of FIG. 10.

Hereinafter, the chip on film package 13 shown in FIGS. 10 and 11 is described with a focus on differences from the chip on film package 10 described with reference to FIGS. 1 to 5.

Referring to FIGS. 10 and 11 together with FIG. 1, a conductive pad 130b may include a trench 137 accommodating a portion of the bump structure 300d. The trench 137 of the conductive pad 130b may extend from one side 191 to the other side 193 of the conductive pad 130b in the first horizontal direction (e.g., the Y direction) along the extension direction of the conductive pad 130b. The bump structure 300d may be continuously connected to the surface of the conductive pad 130b defining the trench 137 of the conductive pad 130b.

The conductive pad 130b may include a first peripheral wall 135 and a second peripheral wall 136 spaced apart from each other with the trench 137 therebetween. The trench 137 of the conductive pad 130b may be defined by the first peripheral wall 135 and the second peripheral wall 136. The first peripheral wall 135 and the second peripheral wall 136 may each be a part of the conductive pad 130b. The first peripheral wall 135 may extend from one side 191 of the conductive pad 130b to the other side 193 of the conductive pad 130b along the edge of the upper surface of the conductive pad 130b, and the second peripheral wall 136 may extend from one side 191 of the conductive pad 130b to the other side 193 along the other edge of the top surface of the conductive pad 130b.

Because a part of the bump structure 300d is accommodated by the trench 137 of the conductive pad 130b, while a thermal compression bonding process is performed, a slip phenomenon between the conductive pad 130b and the bump structure 300d may be prevented and suppressed. For example, even when the bump structure 300d slides along the surface of the conductive pad 130b while the thermal compression bonding process is performed, a sliding range of the bump structure 300d may be limited by the first peripheral wall 135 and the second peripheral wall 136 of the conductive pad 130b. Because the slip phenomenon between the conductive pad 130b and the bump structure 300d may be prevented and suppressed while the thermal compression bonding process is performed, the reliability of the connection between the conductive pad 130b and the bump structure 300d may be improved, and ultimately, the reliability of the chip on film package 13 may be improved.

In example embodiments, a vertical height of the trench 137 of the conductive pad 130b may be between about 0.2 μm and about 2 μm. If the vertical height of the trench 137 of the conductive pad 130b is less than about 0.2 μm, while the thermal compression bonding process is performed, it may be difficult to sufficiently suppress the slip phenomenon between the conductive pad 130b and the bump structure 300d. If the vertical height of the trench 137 of the conductive pad 130b is greater than about 2 μm, the structural stability of the conductive pad 130b may be deteriorated.

A horizontal width of the trench 137 of the conductive pad 130b in the second horizontal direction (e.g., the X direction) may be greater than a horizontal width of the bump structure 300d in the second horizontal direction (e.g., the X direction). Because a horizontal width in the second horizontal direction (e.g., the X direction) of the trench 137 of the conductive pad 130b is greater than a horizontal width in the second horizontal direction (e.g., the X direction) of the bump structure 300d, the bump structure 300d may be spaced apart from at least one of the first peripheral wall 135 and the second peripheral wall 136 of the conductive pad 130b. In example embodiments, the bump structure 300d may be spaced apart from both the first peripheral wall 135 and the second peripheral wall 136 of the conductive pad 130b. In example embodiments, the bump structure 300d may be in contact with only one of the first and second peripheral walls 135 and 136 of the conductive pad 130b, and may be spaced apart from the other of the first peripheral wall 135 and the second peripheral wall 136.

FIGS. 12A to 12E are cross-sectional views illustrating a method of forming a bump structure 300 according to example embodiments.

Figure 12A:
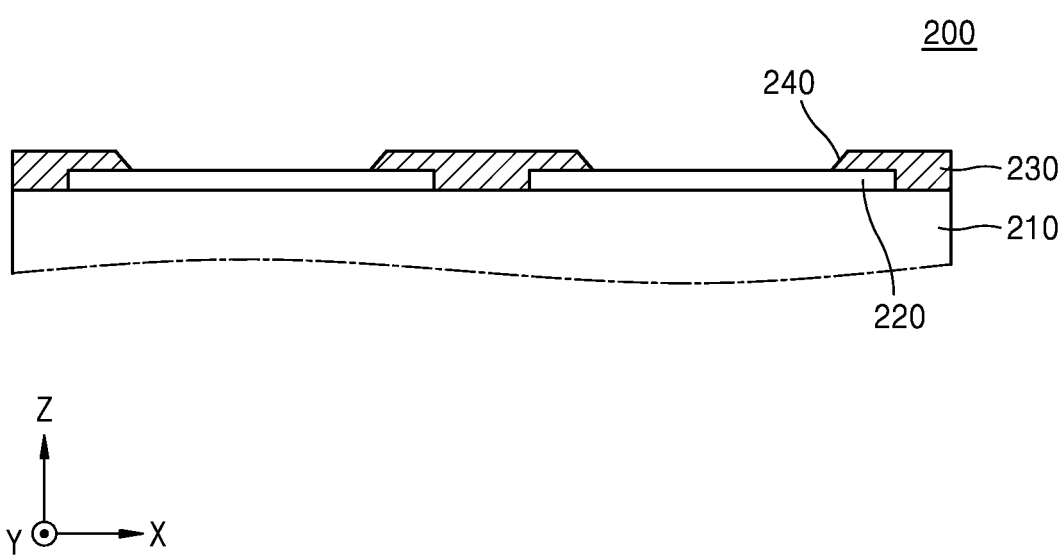
FIGS. 12A, 12B, 12C, 12D and 12E are cross-sectional views showing a method of forming a bump structure according to example embodiments.

Referring to FIG. 12A, a semiconductor chip 200 is prepared. The semiconductor chip 200 may include a substrate 210, a chip pad 220 on the substrate 210, and a passivation layer 230 including an opening 240 at least partially exposing the chip pad 220.

Figure 12B:
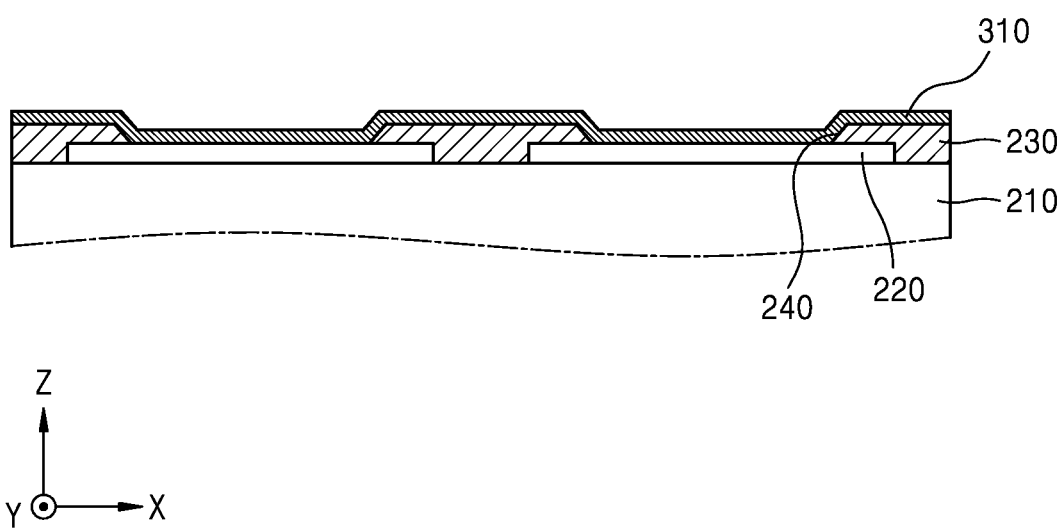

Referring to FIG. 12B, a lower metal layer 310 is formed on the passivation layer 230 and the chip pad 220 exposed through the opening 240 in the passivation layer 230. The lower metal layer 310 may be conform to the passivation layer 230 and the chip pad 220 exposed through the opening 240 in the passivation layer 230. For example, the lower metal layer 310 may be formed through a sputtering process.

Figure 12C:
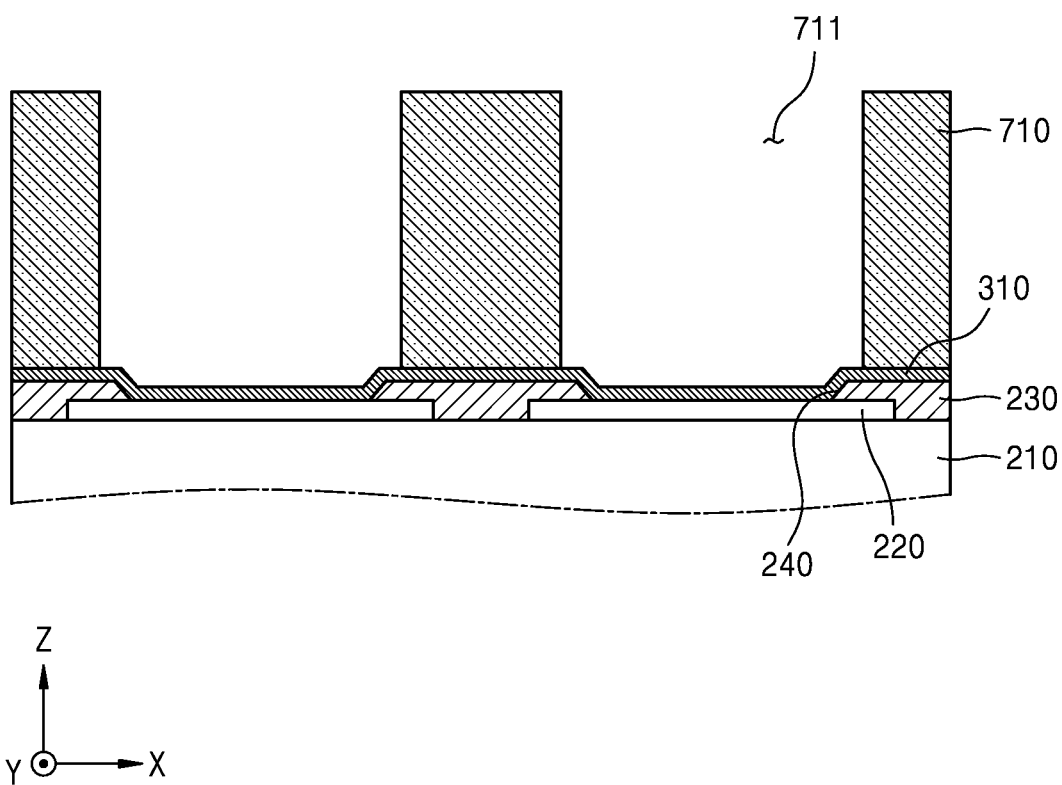

Referring to FIG. 12C, a mask layer 710 is formed on the passivation layer 230. The mask layer 710 may include a mask opening 711 that exposes a part of the passivation layer 230. The mask layer 710 may include a photoresist. For example, a photoresist material layer provided on the passivation layer 230 may be formed, and a patterning process may be performed on the photoresist material layer to form the mask layer 710 in which the mask opening 711 is formed. The mask opening 711 may define a region in which a pillar layer (e.g., 320 of FIG. 12D) formed through a subsequent process is disposed. In some example embodiments, a horizontal width of the mask opening 711 in a second horizontal direction (e.g., the X direction) may be greater than a horizontal width of the trench (330 of FIG. 12D) in a second horizontal direction (e.g., the X direction).

Figure 12D:
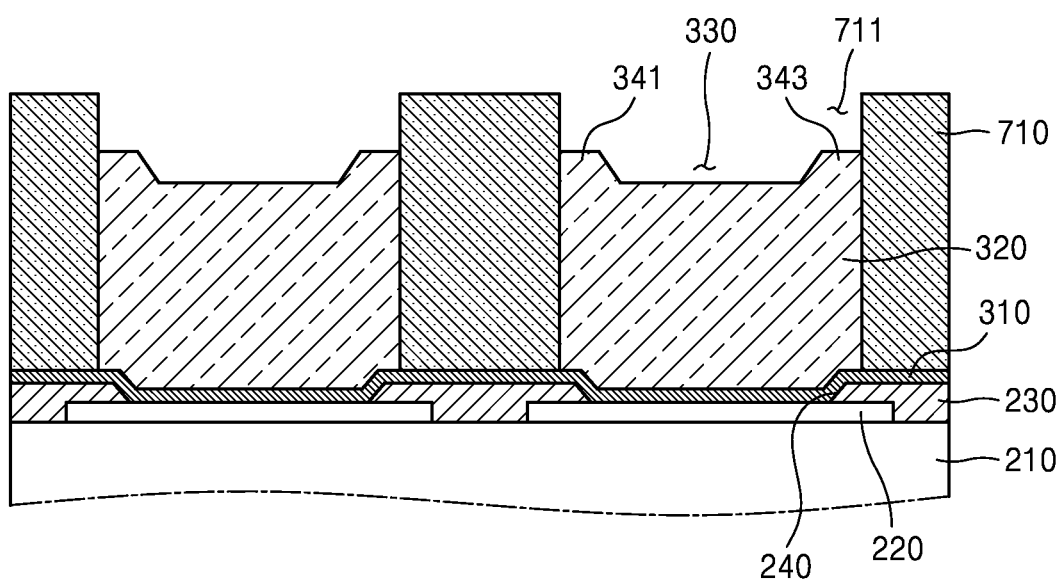
Figure 12D:
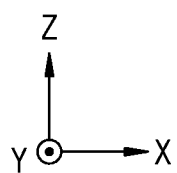

Referring to FIG. 12D, the pillar layer 320 for filling a part of the mask opening 711 of the mask layer 710 is formed. For example, the pillar layer 320 may be formed through a plating process using a bottom metal layer 310 as a seed. When the pillar layer 320 is formed, the lower portion of the pillar layer 320 may be formed to fill the opening 240 in the passivation layer 230, and a recessed trench 330 may be formed on the pillar layer 320.

Figure 12E:
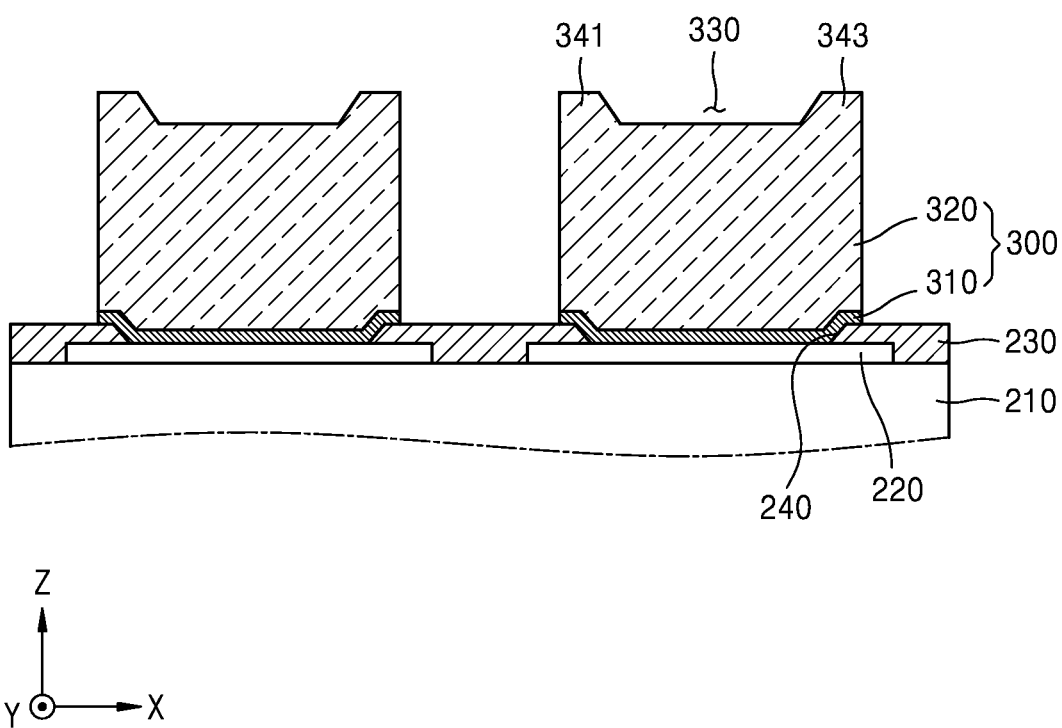

Referring to FIG. 12E together with FIG. 12D, the mask layer 710 may be removed, and a portion of the lower metal layer 310 exposed by removing the mask layer 710 may be removed. The mask layer 710 may be removed, for example, through a strip process. A portion of the lower metal layer 310 exposed by removing the mask layer 710 may be removed through an etching process.

Figure 13A:
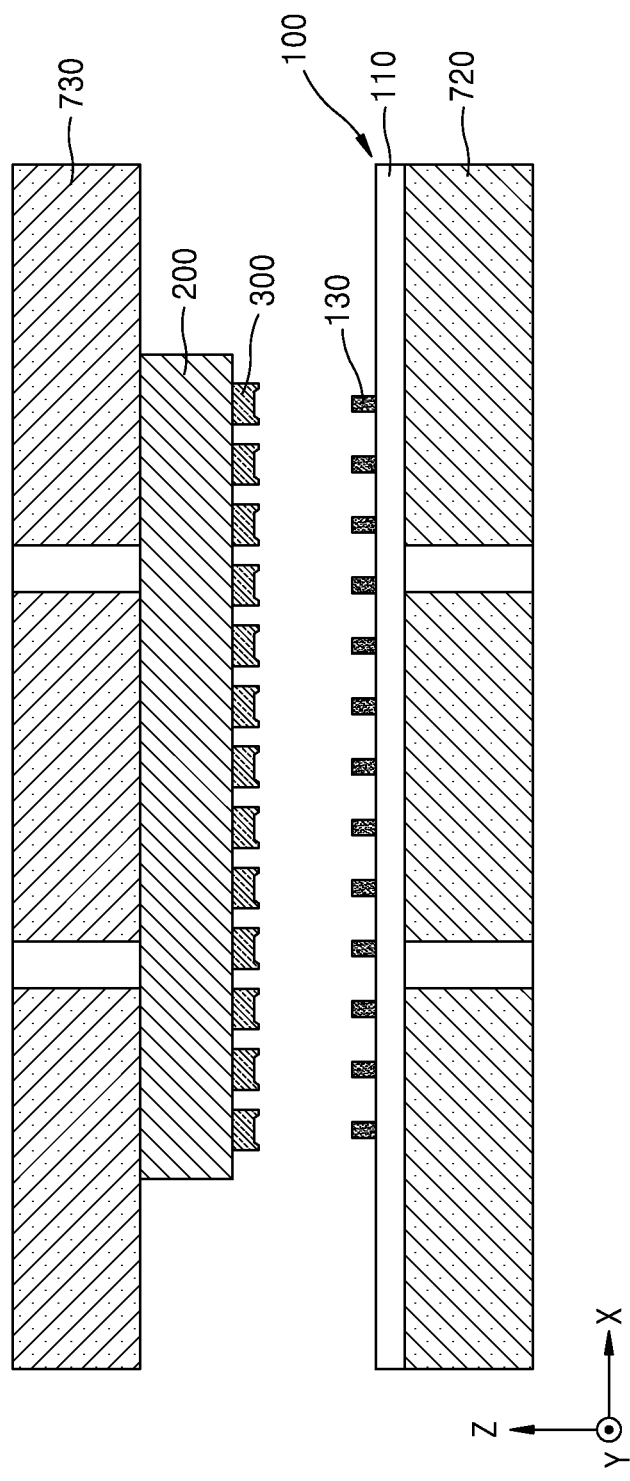
FIGS. 13A and 13B are schematic diagrams showing a method of manufacturing a chip on film according to example embodiments.
Figure 13B:
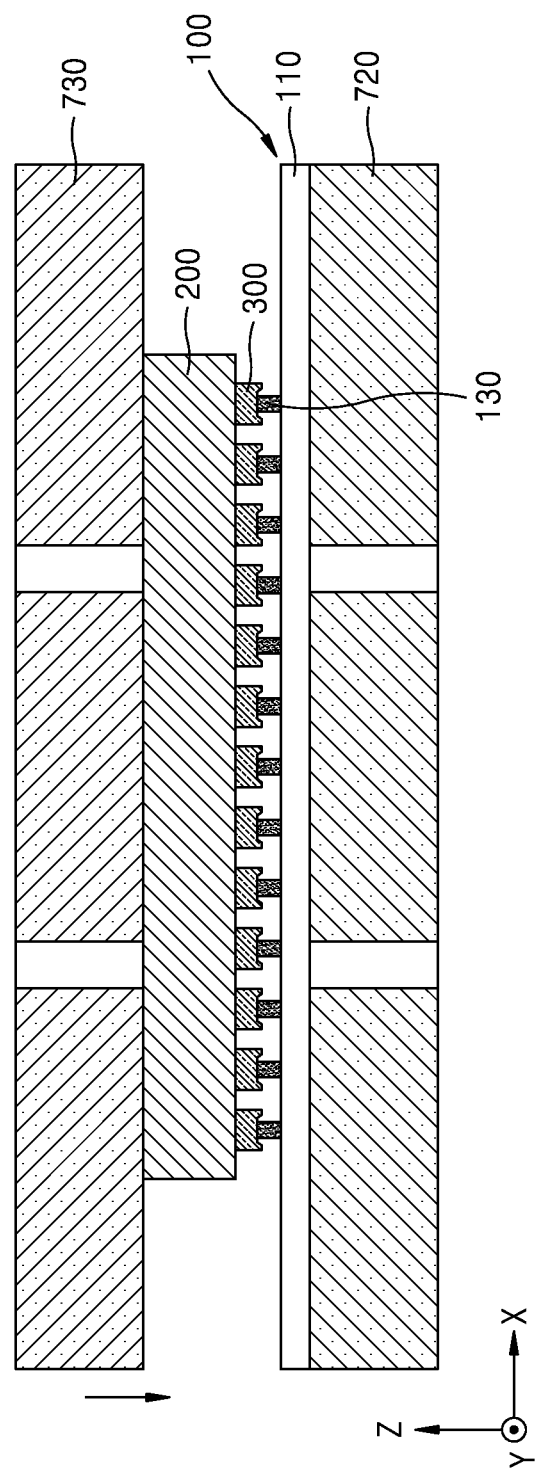

FIGS. 13A and 13B are schematic diagrams showing a method of manufacturing a chip on film according to example embodiments.

Referring to FIG. 13A, a bonding head 730 to which a semiconductor chip 200 is fixed is disposed above a stage 720. The stage 720 has a film substrate 100 placed thereon. The semiconductor chip 200 has a bump structure 300 attached thereto. The trench 330 is formed in the bump structure 300. The bonding head 730 may be positioned such that the bump structure 300 attached to the semiconductor chip 200 is aligned with the conductive pad 130 of the film substrate 100 in a vertical direction (e.g., the Z direction). The stage 720 may support the film substrate 100 positioned on the main surface of the stage 720. For example, the stage 720 may vacuum-adsorb the film substrate 100 so that the film substrate 100 is fixed on a main surface of the stage 720. The bonding head 730 may vacuum-adsorb the semiconductor chip 200 so that the semiconductor chip 200 is fixed on a lower surface of the bonding head 730.

Referring to FIG. 13B, a thermal compression bonding process is performed so that the bump structure 300 and the conductive pad 130 are bonded to each other. The bonding head 730 may descend until the bump structure 300 contacts the conductive pad 130. When the bump structure 300 and the conductive pad 130 are in contact, heat and pressure may be applied to bond the bump structure 300 to the conductive pad 130.

According to example embodiments, because the bump structure 300 includes the trench 330 which accommodates a part of the conductive pad 130, it is possible to prevent and suppress a slip phenomenon between the conductive pad 130 and the bump structure 300 during the thermal compression bonding process. Because the slip phenomenon between the conductive pad 130 and the bump structure 300 may be prevented and suppressed while the thermal compression bonding process is performed, the reliability of the connection between the conductive pad 130 and the bonding structure may be improved, and ultimately, a chip on film package with improved reliability may be manufactured.

Figure 14:
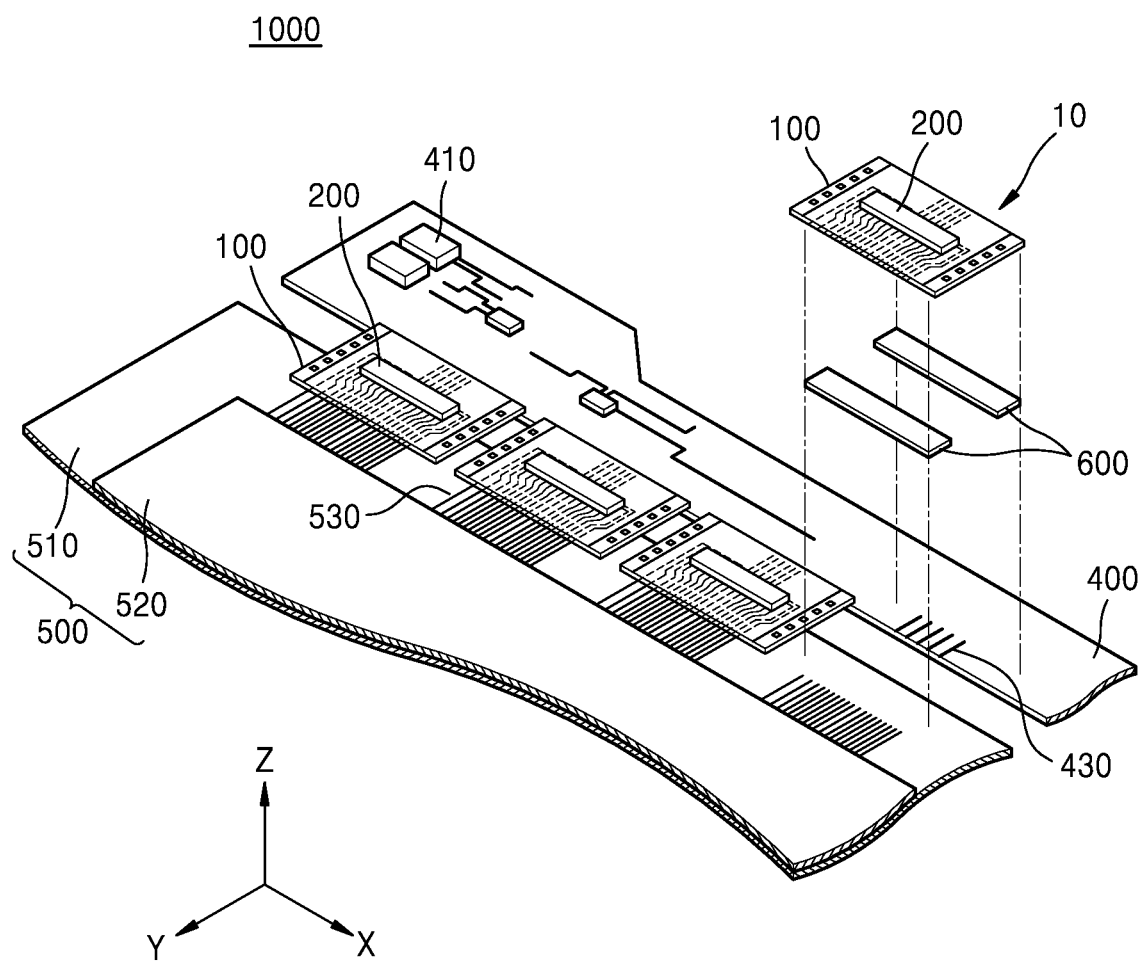
FIG. 14 is a perspective view showing a display device according to example embodiments.

FIG. 14 is a perspective view showing a display device 1000 according to example embodiments.

Referring to FIG. 14, the display device 1000 may include at least one chip on film package 10, a driving printed circuit board 400, and a display panel 500.

The chip on film package 10 may include a film substrate 100 and a semiconductor chip 200 mounted on the film substrate 100. In FIG. 14, the chip on film package 10 is illustrated as being the chip on film package described with reference to FIGS. 1 to 5. However, the chip on film package 10 may correspond to any one of the chip on film packages 11, 12, and 13 described with reference to FIGS. 6 to 11. In FIG. 14, the chip on film package 10 is described with reference to FIGS. 1 to 5 together.

In example embodiments, one chip on film package 10 may include one semiconductor chip 200. In other example embodiments, one chip on film package 10 may include a plurality of semiconductor chips 200 of different types. For example, the plurality of semiconductor chips 200 of different types may include a source driving chip and/or a gate driving chip.

The chip on film package 10 may be positioned between the driving printed circuit board 400 and the display panel 500 to be respectively connected thereto. The chip on film package 10 may receive a signal output from the driving printed circuit board 400 and transmit the signal to the display panel 500.

One or more driving circuit chips 410 capable of simultaneously or sequentially applying power and a signal to the chip on film package 10 may be mounted on the driving printed circuit board 400.

The display panel 500 may be, for example, a liquid crystal display (LCD) panel, a light emitting diode (LED) panel, an organic LED (OLED) panel, a plasma display panel (PDP), or the like.

The chip on film package 10 may be electrically connected to each of a driving connection wiring 430 of the driving printed circuit board 400 and a panel connection wiring 530 of the display panel 500.

In example embodiments, one chip on film package 10 may be connected between the driving printed circuit board 400 and the display panel 500. For example, when the display panel 500 provides a screen with a small area, such as a mobile phone, or supports a relatively low resolution, the display device 1000 may include a single chip on film package 10.

In other example embodiments, a plurality of chip on film packages 10 may be connected between the drive printed circuit board 400 and the display panel 500. For example, when the display panel 500 provides a screen with a large area, such as a television, or supports a relatively high resolution, the display device 1000 may include a plurality of chip on film packages 10.

The chip on film package 10 may be connected only to one side of the display panel 500. However, example embodiments are not limited thereto, and one or a plurality of chip on film packages 10 may be connected to each of two or more side sides of the display panel 500.

The display panel 500 may include a transparent substrate 510, an image area 520 formed on the transparent substrate 510, and a panel connection wire 530. The transparent substrate 510 may be, for example, a glass substrate or a flexible substrate. A plurality of pixels of the image region 520 may be connected to a plurality of corresponding panel connection wires 530, and may be operated depending on a signal provided by the semiconductor chip 200 mounted on the chip on film package 10.

The chip on film package 10 may have an input pad formed on one end and an output pad formed on the other end. Each of the input pad and the output pad may be connected to each of the driving connection wiring 430 of the driving printed circuit board 400 and the panel connection wiring 530 of the display panel 500 by an anisotropic conductive layer 600. The anisotropic conductive layer 600 may be, for example, an anisotropic conductive film or an anisotropic conductive paste. The anisotropic conductive layer 600 may have a structure in which conductive particles are dispersed in an insulating adhesive layer.

While aspects of example embodiments have been particularly shown and described, it will be understood that various changes in form and details may be made therein without departing from the spirit and scope of the following claims.

What is claimed is:

1. A chip on film package comprising:
   a film substrate comprising a base film, a conductive pad extending in a first direction on the base film, and a conductive line pattern extending from the conductive pad;
   a semiconductor chip provided on the film substrate; and
   a bump structure provided between the semiconductor chip and the conductive pad,
   wherein a first peripheral wall and a second peripheral wall of the bump structure extend in the first direction and define a trench, wherein a portion of the conductive pad that is provided in the trench is in contact with the bump structure, and
   wherein the conductive pad is spaced apart from at least one of the first peripheral wall and the second peripheral wall.

2. The chip on film package of claim 1, wherein the first peripheral wall and the second peripheral wall each extend in the first direction from a first edge of the bump structure to a second edge of the bump structure,
   wherein the trench is recessed on a lower surface of the bump structure, and
   wherein the bump structure comprises a metal material.

3. The chip on film package of claim 1, wherein the trench extends in the first direction from a first edge of the bump structure to a second edge of the bump structure,
   wherein a length of the conductive pad in the first direction is greater than a length of the trench in the first direction, and
   wherein the conductive pad protrudes out from each of the first edge and the second edge.

4. The chip on film package of claim 1, wherein a width of the trench in a second direction perpendicular to the first direction is greater than a width of the conductive pad in the second direction, and
   wherein the conductive pad is in contact with either the first peripheral wall or the second peripheral wall.

5. The chip on film package of claim 1, wherein a width of the trench in a second direction perpendicular to the first direction is greater than a width of the conductive pad in the second direction, and
   wherein the conductive pad is spaced apart from both the first peripheral wall and the second peripheral wall.

6. The chip on film package of claim 1, wherein a vertical height of the trench is between about 0.2 μm and about 2 μm.

7. The chip on film package of claim 1, wherein a width of the conductive pad in a second direction perpendicular to the first direction is less than a width of the conductive line pattern in the second direction.

8. The chip on film package of claim 1, wherein the conductive pad comprises:
   a core conductive layer comprising a first metal; and
   a first conductive cover layer comprising a second metal different from the first metal and provided between the core conductive layer and the bump structure.

9. The chip on film package of claim 8, wherein the first metal comprises copper, and
   wherein the second metal comprises tin.

10. The chip on film package of claim 9, wherein the bump structure comprises:
    a pillar layer comprising a third metal; and
    a second conductive cover layer comprising a fourth metal different from the third metal and provided between the pillar layer and the conductive pad.

11. The chip on film package of claim 1, wherein the semiconductor chip comprises:
    a substrate;
    a chip pad provided on the substrate; and
    a passivation layer provided on a portion of the chip pad and defining an opening which exposes the chip pad,
    wherein the bump structure is connected to the chip pad through the opening in the passivation layer, and
    wherein the trench of the bump structure overlaps the opening in the passivation layer along a third direction perpendicular to a surface of the film substrate.

12. The chip on film package of claim 11, wherein a first width of the opening in the first direction is greater than a second width of the opening in a second direction perpendicular to the first direction.

13. The chip on film package of claim 1, wherein the semiconductor chip comprises a display driving integrated circuit.

14. A chip on film package comprising:
    a film substrate comprising a base film, a conductive pad extending in a first direction on the base film, and a conductive line pattern extending from the conductive pad;
    a semiconductor chip provided on the film substrate, the semiconductor chip comprising a substrate, a chip pad provided on the substrate, and a passivation layer, the passivation layer being provided on a portion of the chip pad and defining an opening which exposes the chip pad; and a bump structure provided between the semiconductor chip and the conductive pad, and connected to the chip pad through the opening in the passivation layer, wherein a first peripheral wall and a second peripheral wall of the bump structure extend in the first direction and define a trench, wherein a portion of the conductive pad is provided in the trench, wherein the conductive pad extends in the first direction past a first edge and a second edge of the bump structure, wherein a length of the trench in the first direction is greater than a width of the trench in a second direction perpendicular to the first direction, wherein a first width of the opening in the first direction is greater than a second width of the opening in the second direction, and wherein a width of the trench in the second direction is greater than a width of the conductive pad in the second direction.

15. The chip on film package of claim 14, wherein a pitch between the conductive pad and another conductive pad of the film substrate adjacent to the conductive pad in the second direction is about 20 μm or less.

16. The chip on film package of claim 15, wherein a height of the bump structure in a third direction perpendicular to the first direction and the second direction is between about 9 μm and about 15 μm, wherein a height of the trench in the third direction is between about 0.2 μm and about 2 μm, wherein a height of the conductive pad in the third direction is between about 6 μm and about 10 μm.

17. The chip on film package of claim 16, wherein a width of the bump structure in the first direction is between about 30 μm and about 50 μm, and wherein a width of the bump structure in the second direction is between about 10 μm and about 18 μm.

18. The chip on film package of claim 14, wherein the conductive pad comprises:

a core conductive layer comprising a first metal; and a first conductive cover layer comprising a second metal different from the first metal and provided between the core conductive layer and the bump structure, and wherein the bump structure comprises a third metal different from the first metal and the second metal.

19. The chip on film package of claim 14, wherein the conductive pad is spaced apart from at least one of the first peripheral wall and the second peripheral wall.

20. A chip on film package comprising:

a film substrate comprising a base film, a conductive pad extending in a first direction on the base film, and a conductive line pattern extending from the conductive pad;

a semiconductor chip provided on the film substrate; and a bump structure provided between the semiconductor chip and the conductive pad, wherein a first peripheral wall and a second peripheral wall of the conductive pad extend in the first direction and define a trench, wherein a portion of the bump structure is provided in the trench, and wherein the bump structure is spaced apart from at least one of the first peripheral wall and the second peripheral wall.

* * * * *